(12) United States Patent
Moriyama et al.

(10) Patent No.: US 7,156,917 B2
(45) Date of Patent: Jan. 2, 2007

(54) APPARATUS AND METHOD FOR GROWING CRYSTAL, AND APPARATUS AND METHOD FOR ANALYZING CRYSTAL

(75) Inventors: Hideaki Moriyama, 4452 Birch Hollow Dr., Lincoln, NE (US) 68516; Norio Sugi, Chiyoda-ku (JP); Kazunori Kawasaki, Chiyoda-ku (JP); Shoji Muramatsu, Chiyoda-ku (JP)

(73) Assignees: Hideaki Moriyama, Lincoln, NE (US); IHI Aerospace Co., Ltd., Tokyo (JP)

( * ) Notice: Subject to any disclaimer, the term of this patent is extended or adjusted under 35 U.S.C. 154(b) by 427 days.

(21) Appl. No.: 10/833,115

(22) Filed: Apr. 28, 2004

(65) Prior Publication Data

US 2004/0231580 A1 Nov. 25, 2004

(30) Foreign Application Priority Data

May 22, 2003 (JP) ............................. 2003-144343

(51) Int. Cl.
*C30B 7/02* (2006.01)
(52) U.S. Cl. .............................. 117/68; 117/69; 117/71; 117/927; 422/245.1
(58) Field of Classification Search ................ 117/68, 117/69, 71, 927; 422/245.1
See application file for complete search history.

(56) References Cited

U.S. PATENT DOCUMENTS

| 4,886,646 | A | | 12/1989 | Carter et al. |
| 4,919,899 | A | | 4/1990 | Herrmann et al. |
| 5,078,975 | A | | 1/1992 | Rhodes et al. |
| 5,096,676 | A | * | 3/1992 | McPherson et al. ......... 117/206 |
| 5,130,105 | A | * | 7/1992 | Carter et al. ................. 422/215 |
| 5,256,241 | A | * | 10/1993 | Noever ........................ 117/70 |
| 5,423,287 | A | | 6/1995 | Usami et al. |
| 6,039,804 | A | * | 3/2000 | Kim et al. .................... 117/206 |
| 6,656,267 | B1 | * | 12/2003 | Newman ....................... 117/11 |

OTHER PUBLICATIONS

Craig E. Kundrot et al, "Microgravity and Macromolecular Crystallography", Crystal Growth & Design, vol. 1, No. 1, 2001, pp. 87-99.
Partial European Search Report, completed Jul. 30, 2004.

* cited by examiner

*Primary Examiner*—Robert Kunemund
(74) *Attorney, Agent, or Firm*—Griffin & Szipl, P.C.

(57) ABSTRACT

An apparatus for growing a biological macromolecular crystal by vaporizing biological macromolecular solution into an oversaturated state. The apparatus includes a first sealed room that receives first crystallizing agent solution, and a communicating tube that communicates with the first sealed room and has a small sectional area for suppressing convection of air. A plurality of droplets of solution dissolving a biological macromolecule and a crystallizing agent therein are held in the communicating tube with the plurality of droplets being separated from each other.

19 Claims, 19 Drawing Sheets

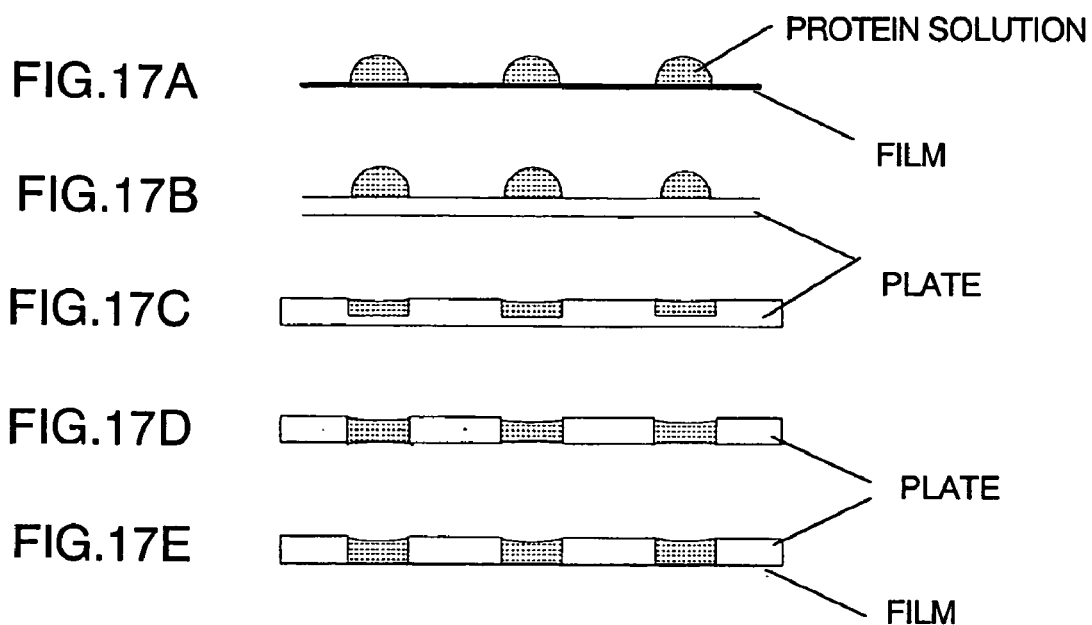
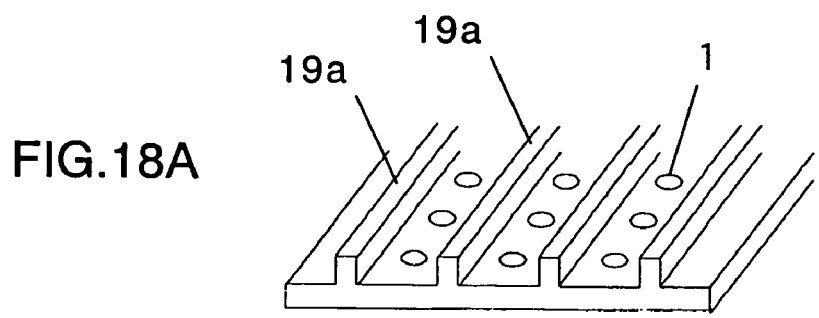
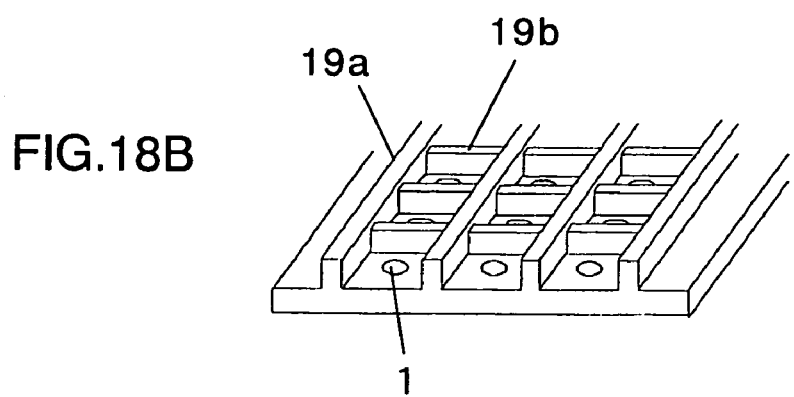

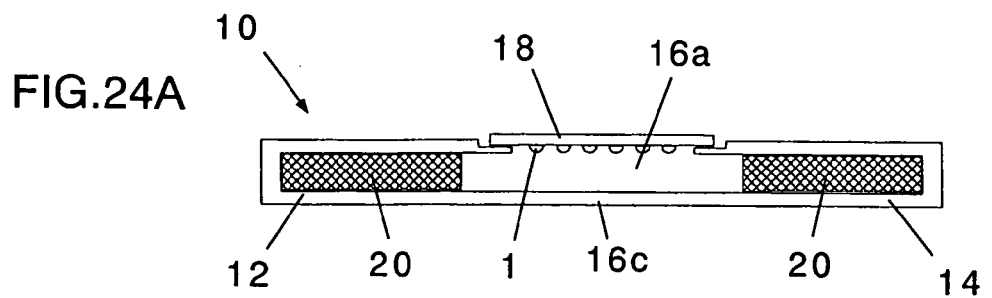
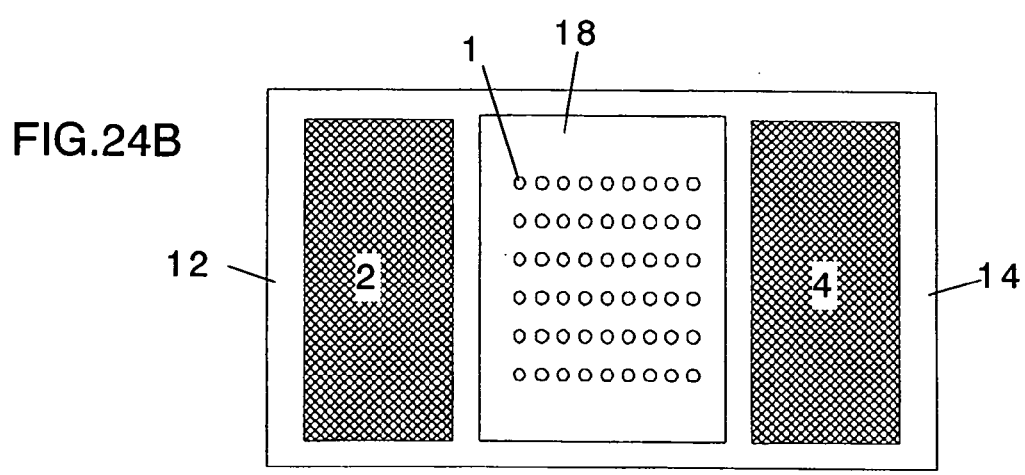
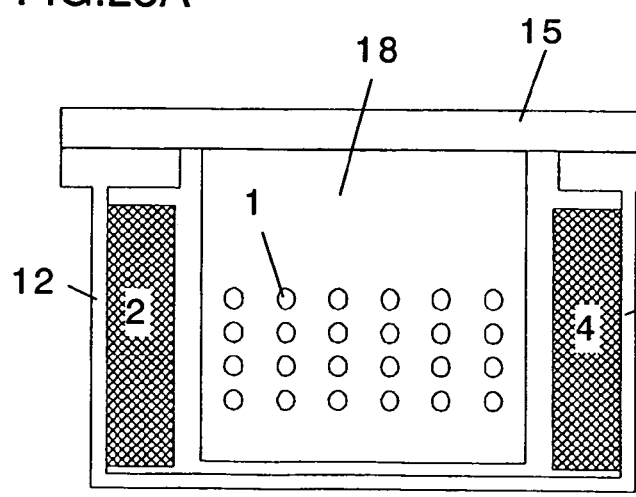
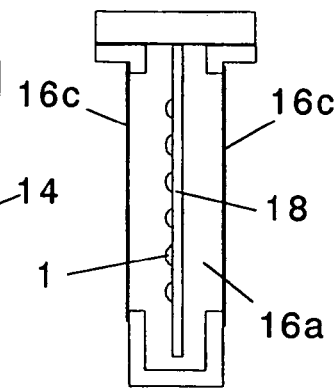

APPARATUS AND METHOD FOR GROWING CRYSTAL, AND APPARATUS AND METHOD FOR ANALYZING CRYSTAL

This application claims priority from Japanese Patent Application No. 2003-144343, filed May 22, 2003, the entire disclosure of which is incorporated herein by reference.

BACKGROUND OF THE INVENTION

1. Field of the Invention

The present invention relates to an apparatus and method for growing a biological macromolecular crystal such as protein, and an apparatus and method for characterization of a biological macromolecular crystal.

2. Description of the Related Art

In this specification, a biological macromolecule means a crystallizable macromolecular substance such as protein, nucleic acid, enzyme and an antibody.

A biological macromolecule has various roles of chemical reaction for life support in a living body. To elucidate a mechanism of vital activity, or to develop a medicine of a high effect, it is very important to understand functions of a biological macromolecule. The functions of a biological macromolecule is deeply associated with a three-dimensional structure of the biological macromolecule. In order to understand the functions of the biological macromolecule, various methods for elucidating the three-dimensional structure have been attempted.

Among them, X-ray structure analysis is one of the most effective methods for investigating the three-dimensional structure.

Performing of the X-ray structure analysis needs preparation of a biological macromolecular crystal. Generally, it is difficult to predict a condition for crystallization, and it is also necessary to experimentally screen many parameters such as a crystallizing agent type, crystallizing agent concentration, biological macromolecular concentration, buffer type, pH and temperature. Usually, crystallization takes several days to several weeks, so that it takes a large amount of labor and time to grow a single high-quality crystal. Therefore, a step of obtaining a single high-quality crystal of the biological macromolecule is a bottleneck for the X-ray structure analysis.

Recently, biological macromolecule crystallization using a space environment has been carried out. In a space environment, since gravity does not act on the crystal nucleus, the crystal nucleus does not sink to a bottom part of solution, and no convection of air around the crystal can be realized. Accordingly, it is considered that space can provide good environment for crystal growth. For this reason, it has been attempted to produce high-quality crystal in space, and to recover the crystal for carrying out the X-ray structure analysis on the earth.

Biological macromolecule crystallizing means and biological macromolecule X-ray structure analysis are disclosed in Documents 1 through 13.

[Document 1] Biological Crystal Producing Handbook (publisher: Maruzen Inc., author: Reimei Hirayama)

[Document 2] X-ray analysis of protein (publisher: Kyouritu Inc. author: Mamoru Sato)

[Document 3] Japanese Laid-Open Patent Publication No. 2001-213699

[Document 4] Japanese Laid-Open Patent Publication No. 2002-233702

[Document 5] Japanese Laid-Open Patent Publication No. 6-300718

[Document 6] Japanese Laid-Open Patent Publication No. 11-94773

[Document 7] Japanese Patent No. 2650274

[Document 8] Japanese Laid-Open Patent Publication No. 6-62848

[Document 9] Japanese Laid-Open Patent Publication No. 6-321700

[Document 10] Japanese Laid-Open Patent Publication No. 6-183400

[Document 11] Japanese Laid-Open Patent Publication No. 6-157598

[Document 12] Japanese Laid-Open Patent Publication No. 6-116098

[Document 13] Japanese Laid-Open Patent Publication No. 5-25000

FIGS. 1A and 1B show a principle of "crystallization of protein by a vapor diffusion method" disclosed in Document 2.

In FIG. 1B, concentration change of biological macromolecules (protein) in crystallizing solution is schematically shown with respect to concentration change of a crystallizing agent (salt) in the solution. In this drawing, "(1)" designates a solubility curve, and "A" designates an unsaturated region A where a biological macromolecule is completely dissolved. "B", "C" and "D" designate oversaturated regions B, C and D where association of the biological macromolecules occurs. However, stable nucleation requires a certain level of oversaturation. Accordingly, in the low-level oversaturated region B, even if the association occurs, the association is unstable, so that the macromolecules are disassociated in a short time. On the other hand, in the high-level oversaturated region D, even if the association occurs, deposit is generated without occurring of specific interaction necessary for the nucleation. Therefore, for biological macromolecule crystallization, it is necessary to adjust the solubility of the biological macromolecule such that the solution is brought into the region C.

As shown in FIG. 1A, in the vapor diffusion method, there are three methods of placing the biological macromolecular solution, that is, hanging drop method, sitting drop method and sandwich method. In the vapor diffusion method, a droplet of biological macromolecular (protein) solution containing a crystallizing agent (precipitating agent) is placed in a closed container in which buffer solution containing a precipitating agent is also placed. In this container, the biological macromolecules are crystallized with the biological macromolecular solution droplet being vaporized. At first, the biological macromolecular solution containing the crystallizing agent stays in the unsaturated region A, the biological macromolecules are completely dissolved. After water in the biological macromolecular solution gradually evaporates in the closed container, the state of the biological macromolecular solution is changed to the oversaturated region C. The crystal is precipitated in the region C, and then, the concentration of the biological macromolecular solution gradually decreases, so that the state of the biological macromolecular solution reaches the solubility curve (1) where the crystal precipitation stops.

Document 3 of which title is "Crystal Adjusting Device, Crystal Adjusting Method and Device Kit" discloses a screening apparatus that aims to make conditions suitable to crystallization of various macromolecules in a short time.

According to Document 3, as shown in FIGS. 2A and 2B, the crystal adjusting apparatus 170 includes a first board 171 and a plurality of second boards 172. The first board 171 has a plurality of penetration holes separated from each other. The second boards 172 each have plural surface portions having different surface potentials or different zeta potentials. The second boards 172 are arranged to cover a plurality of the penetration holes 173. At each of a plurality of portions 174 for holding solution, the plural surface portions that have different surface potentials or zeta potentials contact with the solution. In FIG. 2B, the reference numeral 175 designates a protrusion part, and 176 a concave part.

Document 4 of which title is "Crystal Growing Apparatus, Apparatus Components and Crystal Growing Method" discloses an apparatus that aims to control a water vaporizing speed without changing a type or concentration of a precipitating agent in a process of crystallizing biological macromolecules by the vapor diffusion method.

According to Document 4, as shown in FIG. 3, the crystal growing apparatus includes a closable container 211 that receives several droplets of biological macromolecular solution, and a separation plate 213 that separates an inside space of the container 211 into a first room 218 and a second room 219. The first room 218 receives a precipitating agent 220, and the second room 219 receives the droplets 221. In a crystallization process, a substance diffuses between the first and second rooms through penetration holes 232 of the separation board 213. In FIG. 3, the reference numeral 212 designates a protrusion part, 214 an upper wall part, 215 a cover, and 231 a concave part.

Document 5 of which title is "X-ray Analyzing Apparatus" discloses an apparatus that aims to easily perform X-ray analysis of a minute region of a sample by greatly changing a position of the sample.

According to Document 5, as shown in FIG. 4, an X-ray optical element that has focusing and imaging functions and has a long operating distance is incorporated in an X-ray generation apparatus. A sample scanning table 310 is provided with a goniostage 315, a rotary stage 313, a straight moving stages 317, 318 and 319 that can precisely move in directions of three axes, respectively. The sample scanning table 310 is installed such the rotational axis of the sample scanning table 310 is included in the focal plane of the X-ray optical element. Further, a rotatable X-ray position detector or an X-ray energy detector is provided to move around the sample scanning table 310. In FIG. 4, the reference numeral 302 designates an X-ray optical axis, and 320 a large sample holder.

Document 6 discloses an X-ray analyzing apparatus that aims to efficiently measure many samples with high accuracy.

According to the X-ray analyzing apparatus 401 of Document 6 shown in FIG. 5, when a plurality of samples are set in a sample magazine 409, a compressed spring provided in the sample magazine 409 pushes the sample via a plate member toward a body part of a jig 408 so that the pushed sample can enter a sample hole 413a or 413b of an arm member 412 facing the sample magazine 409 and be pushed against a front edge surface of an upper arm part and a step of a lower arm part of the jig 408 that extends out from the sample hole. In this state, an X-ray generator 402 emits an X ray 405 to the sample, and the X ray 405 reflected and diffracted by the sample is detected by an X-ray detector 403. Next, a driving motor 416 moves the arm member 412 to a position where the other sample hole 413a or 413b faces the sample magazine 409, and the sample in the sample magazine 409 is made to enter the other sample hole 413a or 413b while the measured sample is made to drop to a receiving plate 418a or 418b. Then, next measurement is performed. In FIG. 5, the reference numeral 407 designates a rotary table.

The above-described vapor diffusion method is the most used for crystallizing the biological macromolecules. In the vapor diffusion method, a droplet of solution that is a mixture of biological macromolecular solution and crystallizing agent solution is placed in a closed system in which another crystallizing agent solution having higher concentration of a crystallizing agent than that of the droplet is also placed. In this manner, when the system reaches vapor equilibrium of vapor pressure between the droplet and the crystallizing agent solution, the droplet is concentrated so that the concentration of the crystallizing agent (and also the concentration of the biological macromolecules) can be increased.

FIG. 6 is a schematic illustration of the hanging drop method that is the most used manner in the vapor diffusion method. The hanging drop method uses a plate having a plurality of wells that function as biological macromolecule crystal growing rooms to perform crystallization. For example, a commercially available plate has four columns and six rows, that is, 24 wells.

Except that a preferable condition for crystal precipitating and growing is previously known, it is rare to obtain a high-quality crystal of biological macromolecules in the droplet. It is difficult to theoretically predict a preferable condition for the crystallization of the biological macromolecules. Generally, crystallization is attempted by changing, little by little, a condition such as a crystallizing agent type, crystallizing agent concentration, a biological macromolecular concentration, a type of buffer solution dissolving the biological macromolecules, pH, and a crystallizing temperature. Such a screening process of trial and error is repeatedly performed. Generally, after attempting many conditions, a good condition can be found for crystallization. Accordingly, it is desired to develop a crystallizing method of efficiently screening crystallizing conditions as easily as possible.

A conventional vapor diffusion method such as the hanging drop method has an advantage of a small necessary amount of biological macromolecular solution. However, a combination of a droplet (including biological macromolecular solution) and crystallizing agent solution needs to be set in each well of a closed system. Accordingly, there is a large trouble of setting droplets in many wells.

Change of a concentration of a droplet in the conventional vapor diffusion method shown in FIG. 6 is as follows.

(1) After setting, as time elapses, the droplet is concentrated by water vaporization, and the concentration of the biological macromolecules and the concentration of the crystallizing agent are increased.

(2) The concentration of the biological macromolecules and the concentration of the crystallizing agent are changed to a region where a nucleus can be formed.

(3) Subsequently, crystal growth occurs, and as protein molecule in the solution is attracted to the crystal, the concentration of the protein is decreased.

Through the above stages (1) to (4), the concentration of the crystallizing agent in the droplet is increased toward the concentration of the crystallizing agent solution. A concentrating speed depends on a size and shape of a container (closed system) as well as a temperature, a droplet size, a crystallizing agent type, and a crystallizing agent concentration. Since a droplet concentration changing speed affects kinetics of crystal growth, a droplet concentration changing speed is considered to be one of condition parameters for obtaining high-quality crystal. Conventionally, a condition for a concentration changing speed is not actively changed except for changing of a temperature, a droplet size, a crystallizing agent type, and a concentration. Accordingly, there was a possibility that an important condition was not screened.

To elucidate functions of a biological macromolecule, it is inevitable to know a three-dimensional structure of the biological macromolecule. For this reason, X-ray diffraction measurement for crystal structure analysis is performed on a single crystal of biological macromolecules obtained by crystallization. The produced biological macromolecular crystal is taken out from an apparatus, and is mounted on a jig to be attached to a goniometer head of an X-ray diffraction measuring apparatus. Crystallization is performed in various methods, but the produced crystal is generally mounted on the jig in the following method.

FIG. 7A shows one crystal mounting method that uses a capillary. A crystallizing mother liquid is put in a thin glass-made capillary having a thickness of about 1 mm, and both ends of the capillary are sealed. Then, the capillary is attached to a goniometer. FIG. 7B shows another crystal mounting method that uses a cryoloop. A cryoloop that has a diameter of about 0.1 mm to 1 mm and that is made of nylon fiber having a diameter of 10 µm to 20 µm is commercially available. The mother liquid is scooped together with a crystal by the loop so that the crystal can be held by surface tension. This method is used mainly for X-ray diffraction at a low temperature by streaming extremely-low-temperature gas such as nitrogen onto the crystal held by the loop. Thus, one target crystal is taken out from an apparatus, and is mounted on a some sort of jig to be attached to a goniometer.

Structure analysis of a biological macromolecular becomes more important, and researchers in several countries are performing intense study on this. However, among a large number of biological macromolecule types that function in a living body, a three-dimensional structure of only a small part of them became clear. It is required to raise a processing speed of the crystal structure analysis. For this, it is desired to achieve high throughput by automation or efficiency improvement of manual working.

One obstacle for the high throughput is work of taking out a produced crystal, mounting the crystal on a jig, and attaching the jig to a goniometer. Since this work is performed for each X-ray diffraction, a great trouble is required. Furthermore, this work requires a high skill, and automation of this work is difficult. Accordingly, for high throughput, it is desired to efficiently perform the work of taking out a crystal, mounting the crystal on a jig, and attaching the jig to a goniometer.

SUMMARY OF THE INVENTION

The present invention was made in order to solve and satisfy the above problems and desires. That is, it is a first object of the present invention to provide an apparatus and method for growing a biological macromolecular crystal in which screening can be performed easily.

It is a second object of the present invention to provide an apparatus for growing a biological macromolecular crystal in which screening that takes into account a parameter of a concentrating speed is performed by one experiment.

It is a third object of the present invention to provide an apparatus for growing a biological macromolecular crystal in which crystallization of biological macromolecular solution can be performed in a space environment.

Further, it is a fourth object of the present invention to provide an apparatus and method for analyzing a crystal in which structure analysis of plural biological macromolecular crystals can be efficiently performed, and working that has been manually performed can be streamlined and automated to achieve high throughput.

According to the present invention, there is provide an apparatus for growing a crystal by vaporizing biological macromolecular solution into an oversaturated state, comprising: a first sealed room that receives first crystallizing agent solution; and a communicating tube that communicates with the first sealed room and has a small sectional area for suppressing convection of air, wherein a plurality of droplets of solution dissolving a biological macromolecule and a crystallizing agent therein are held in the communicating tube with the plurality of droplets being separated from each other.

Further, according to the present invention, there is provided a method for growing a crystal, comprising the steps of: putting in a communicating tube a plurality of droplets separated from each other, wherein the plurality of droplets are made of solution dissolving a biological macromolecule and a crystallizing agent therein, the communicating tube communicates with a room that receives first crystallizing agent solution, and the communicating tube has a sectional area that suppresses convection of air; and holding the plurality of droplets in the communicating tube until the plurality of droplets are vaporized into an oversaturated state to produce biological macromolecular crystals.

In the above apparatus and method for growing a biological macromolecular, the sectional area of the communication tube is so small that convection of air in the tube can be suppressed. The first sealed room that communicates with the communicating tube receives the first crystallizing agent solution. Accordingly, the water vapor from the droplets is transported by diffusion, and a vaporizing speed differs depending on positions. Further, the droplet located near the first sealed room more promptly reaches an equilibrium state with the first crystallizing agent solution. On the other hand, the droplet located far from the first sealed room more slowly reaches an equilibrium state with the first crystallizing agent solution. Therefore, a droplet concentrating speed gradually changes in accordance with a distance from the connecting position between the first sealed room and the communicating tube.

In this manner, while fixing conventional parameters of a crystallizing agent concentration and a crystallizing agent type, screening that takes a concentrating speed into account can be efficiently performed by one experiment.

According to one aspect of the present invention, the communicating tube further communicates with a room that receives second crystallizing agent solution of which water vapor pressure is different from water vapor pressure of the first crystallizing agent solution.

Thereby, the first sealed room communicates with the second sealed room through the communicating tube. Further, the first sealed room receives the first crystallizing agent solution, and the second sealed room receives the second crystallizing agent solution of which water vapor pressure is different from that of the first crystallizing agent solution so that water vapor pressures at both ends of the communicating tube becomes different to generate a gradient of a partial pressure of a water vapor.

Preferably, a water vapor pressure of the droplet is set to be equal to or higher than the higher of the water vapor pressure of the first crystallizing agent solution and the water vapor pressure of the second crystallizing agent solution.

Thereby, a water vapor pressure in the communicating tube is lower than the water vapor pressure of the droplet, so that water is evaporated from the droplets.

Preferably, a quantity of the first crystallizing agent solution and a quantity of the second crystallizing agent solution are set to be adequately larger than a quantity of the droplet. Thereby, in a time scale that crystallization occurs in the droplet, the droplet near the first crystallizing agent solution is vaporized to have a concentration close to a concentration of the first crystallizing agent solution, the droplet near the second crystallizing agent solution is vaporized to have a concentration close to a concentration of the second crystallizing agent solution, and the droplet located at middle part of the communicating tube is vaporized to have an intermediate concentration between the first crystallizing agent solution and the second crystallizing agent solution. Even if initial droplets have the same composition, it is possible to make different crystallizing conditions depending on positions in the communicating tube, and to efficiently perform screening by one setting.

According to another aspect of the present invention, the apparatus comprises a crystal growing plate that holds the plurality of droplets separated from each other in the communicating tube.

With this configuration, a plurality of droplets can be held by the crystal growing plate to facilitate handling of the droplets.

Preferably, the communicating tube includes a growing plate attaching wall that constitutes a side surface of a communicating passage in the communicating tube, and the crystal growing plate is detachably attached to an opening formed on the growing plate attaching wall to airtightly close the opening.

With this configuration, only by attaching the crystal growing plate to the opening, a plurality of droplets held by the crystal growing plate can be easily set for screening of crystallizing conditions corresponding to the number of the droplets.

According to another aspect of the present invention, the communicating tube includes an observing wall that faces the growing plate attaching wall.

With this configuration, it is possible to observe a crystal growing process through growing plate attaching wall (the crystal growing plate) and/or the observing wall. Furthermore, it is possible to analyze the produced crystal and investigate physical and chemical states of the solution and the crystal in the droplet. Preferably, for the observation, both the crystal growing plate and the observing wall are transparent.

According to another aspect of the present invention, the apparatus comprises: a plurality of first sealed rooms; a plurality of second sealed rooms; a plurality of communicating tubes; and a plurality of crystal growing plates, wherein each of the plurality of first sealed rooms communicates with one of the plurality of second sealed rooms through one of the plurality of communicating tubes, and the plurality of communicating tubes are provided with the plurality of crystal growing plates, respectively.

With this configuration, by using a plurality of the first crystallizing agent solutions and second crystallizing agent solutions, it is possible to attempt many crystallizing conditions each of which includes gradually changing droplet concentrating conditions. Therefore, such a screening can be easily performed.

According to another aspect of the present invention, the apparatus comprises a holding body set in the first sealed room and/or the second sealed room for soaking up the first crystallizing agent solution and/or the second crystallizing agent solution.

With this configuration, by using the holding body, it is possible to soak up the first crystallizing agent solution and/or the second crystallizing agent solution. Thereby, the apparatus for growing a crystal can be set in a free posture, so that handling of the apparatus for growing a crystal can be improved. Further, it becomes possible to apply the apparatus to crystallization of biological macromolecules in a space environment.

According to another aspect of the present invention, gels of the plurality of droplets are held by the crystal growing plate.

Thereby, the apparatus can be set in a free posture, so that handling of the apparatus can be improved. Furthermore, the crystal can be fixed in the solution (droplet), so that X-ray analysis can be performed on the crystal without taking out the crystal from the solution.

According to another aspect of the present invention, the apparatus comprises a crystallization starting mechanism that opens the first sealed room and/or the second sealed room to the communicating tube, and closes the first sealed room and/or the second sealed room from the communicating tube.

With this configuration, in a state in which the first sealed room and/or the second sealed room is closed from the communicating tube, the apparatus for growing a crystal can be launched from the earth, and when the apparatus reaches a space environment, the first sealed room and/or the second sealed room is opened to the communicating tube to start crystal growing.

According to another aspect of the present invention, the crystal growing plate includes cavities or penetration holes for holding the plurality of droplets that are separated from each other.

With this configuration, by using the cavities or penetration holes, it is possible to more firmly hold the droplets. Thereby, the apparatus can be set in a free posture, so that handling of the apparatus can be improved. Further, it becomes possible to apply the apparatus to crystallization of biological macromolecules in a space environment.

According to another aspect of the present invention, the crystal growing plate is provided with one or more partitions or shielding plates for reducing interference between the plurality of droplets and suppressing convection of air.

With this configuration, it is possible to reduce interference between a plurality of droplets, and suppress convection of air in the communicating tube.

Furthermore, according to the present invention, there is provided an apparatus for analyzing a crystal, comprising: an apparatus for growing biological macromolecular crystals from a plurality of droplets of biological macromolecular solution that are two-dimensionally and densely arranged on a crystal growing plate that has X-ray transparency and x-ray resistance; a crystal moving mechanism to which the apparatus for growing the crystals or the crystal growing plate taken out from the apparatus for growing the crystals is attached; and a goniometer head that enables the apparatus for growing the crystals or the crystal growing plate to be attached to a sample rotating mechanism of a X-ray analyzing apparatus.

Further, according to the present invention, there is provided a method for analyzing a crystal, comprising: a crystal growing step of performing crystallization on a plurality of droplets of biological macromolecular solution that are two-dimensionally and densely arranged on a crystal growing plate of an apparatus for growing crystals; a growing apparatus attaching step of attaching the apparatus for growing the crystals or the crystal growing plate to a crystal moving mechanism that is attached to a X-ray analyzing apparatus via a goniometer; and a X-ray analyzing step of successively moving biological macromolecular crystals on the crystal growing plate by the crystal moving mechanism to a position on a X-ray beam and on a rotational axis of the sample rotating mechanism to repeatedly perform X-ray analysis of the biological macromolecular crystals.

In the above apparatus and method for analyzing a crystal, crystallization is performed on droplets of biological macromolecular solution two-dimensionally and densely arranged on the crystal growing plate, and then, the apparatus for growing the crystals or the crystal growing plate taken out from the apparatus for growing the crystals is attached to the crystal moving mechanism. Next, the crystals on the crystal growing plate are successively moved to the position on an X-ray beam and on the rotational axis of the sample rotating device to successively perform X-ray analysis of the crystals.

Therefore, it is possible to efficiently perform structure analysis of a plurality of crystals. Thus, the working that has been manually performed can be streamlined and automated to achieve high throughput.

Other objects, features and advantages of the present invention will become apparent from the following description with reference to the attached drawings.

BRIEF DESCRIPTION OF DRAWINGS

FIGS. 11A, 11B and 11C are sectional views showing apparatuses for growing a crystal according to a second embodiment of the present invention;

FIGS. 17A though 17E are sectional views showing examples of crystal growing plates according to the present invention;

FIGS. 18A and 18B are perspective views showing other examples of the crystal growing plate according to the present invention;

FIGS. 24A and 24B are respectively a sectional view and a plan view showing an apparatus for growing a crystal according to a tenth embodiment of the present invention;

FIGS. 25A and 25B show an apparatus for growing a crystal according to an eleventh embodiment of the present invention;

DESCRIPTION OF THE PREFERRED EMBODIMENTS

Figure 8A:
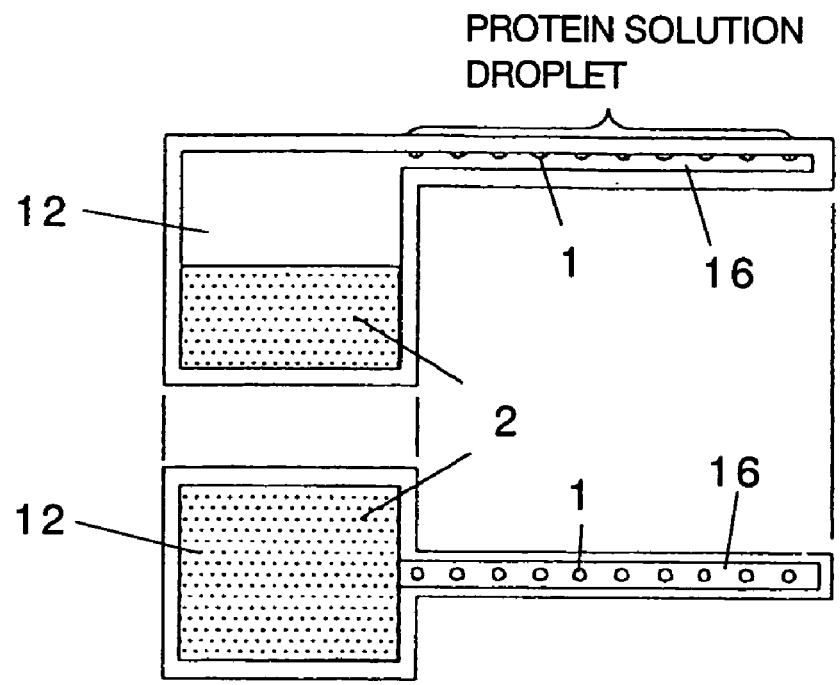
FIGS. 8A and 8B show an apparatus for growing a crystal according to a first embodiment of the present invention.
Figure 8B:
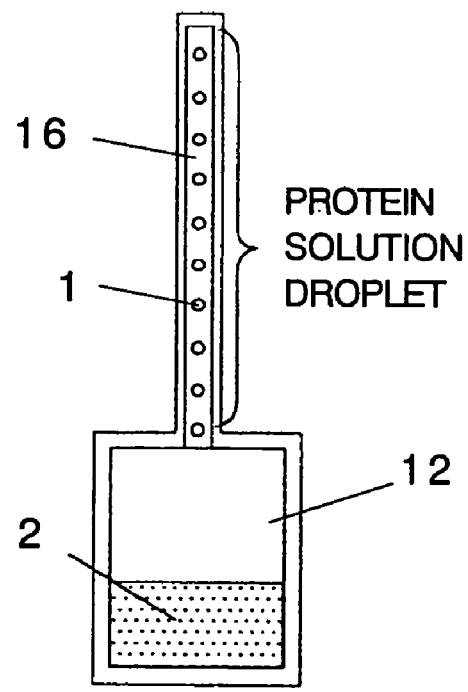

In the following, preferred embodiments of the present invention will be described with reference to the drawings. In the drawings, the same reference numeral is attached to a common part or member, and overlapping description is omitted. FIGS. 8A and 8B show apparatuses for growing a crystal according to a first embodiment of the present invention. The apparatus for growing a crystal of FIG. 8A is horizontally set, and the apparatus for growing a crystal of FIG. 8B is vertically set. In the apparatus for growing a crystal of each of FIGS. 8A and 8B, a droplet 1 including biological macromolecules is oversaturated by evaporating water from the droplet 1 to grow biological macromolecular crystal.

This apparatus for growing a crystal includes a first sealed room 12 that receives first crystallizing agent solution 2, a communicating tube 16 that communicates with the first sealed room 12. The communicating tube 16 has a small sectional area to suppress inside convection of air. The section of the communicating tube 16 may be thin, flat, plate-shaped, or may be canalicular. The sectional area of the communicating tube 16 is preferably constant in the longitudinal direction, but in accordance with necessity, the sectional area may gradually increase or decrease.

In the communicating tube 16, a plurality of droplets 1 of solution including dissolved biological macromolecules and a dissolved crystallizing agent are held and separated from each other. According to the first embodiment, by using the apparatus having the above configuration, water in the droplets 1 of solution dissolving the biological macromolecules and the crystallizing agent therein is vaporized, and the droplets 1 are oversaturated to produce a biological macromolecular crystal with a plurality of droplets 1 being held and separated from each other in the communicating tube 16.

Figure 1A:
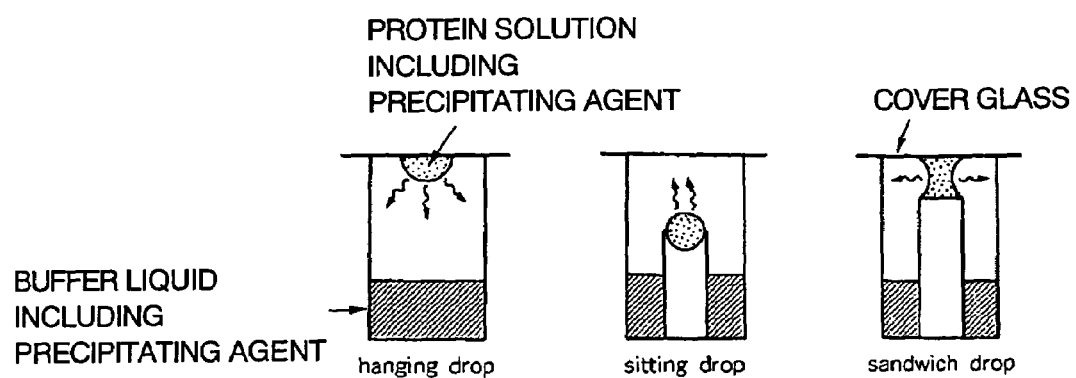
FIGS. 1A and 1B show a principle of crystallizing biological macromolecular solution by vapor diffusion.
Figure 1B:
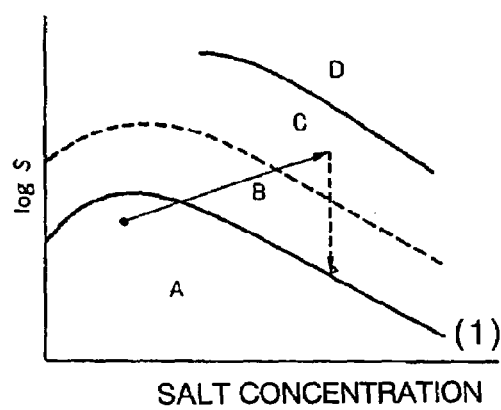
Figure 2A:
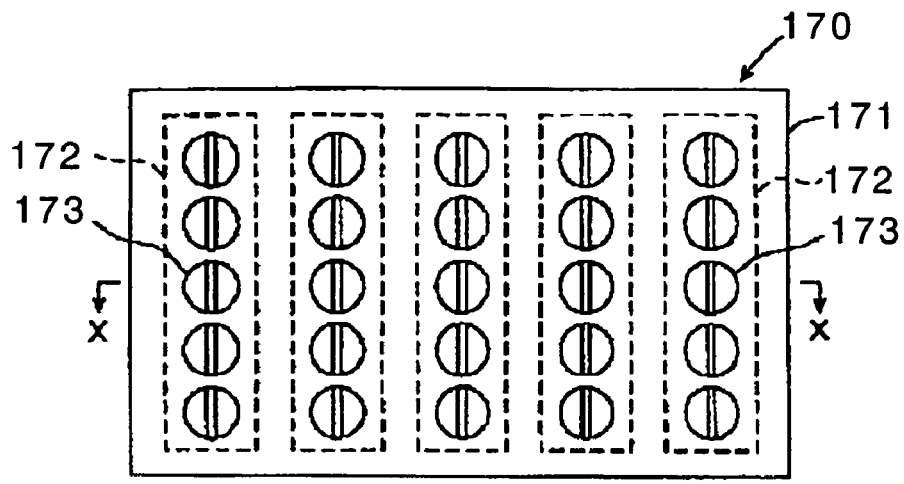
FIGS. 2A and 2B show conventional crystal growing technique.
Figure 2B:
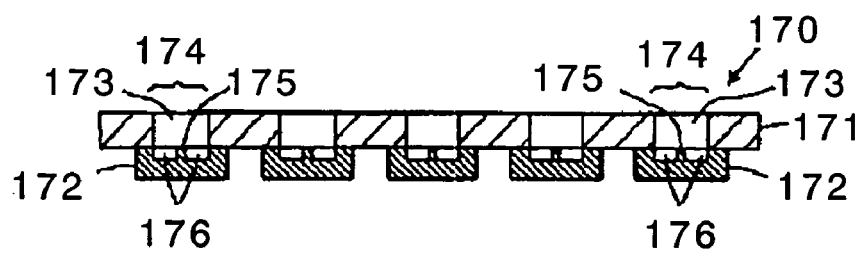
Figure 3:
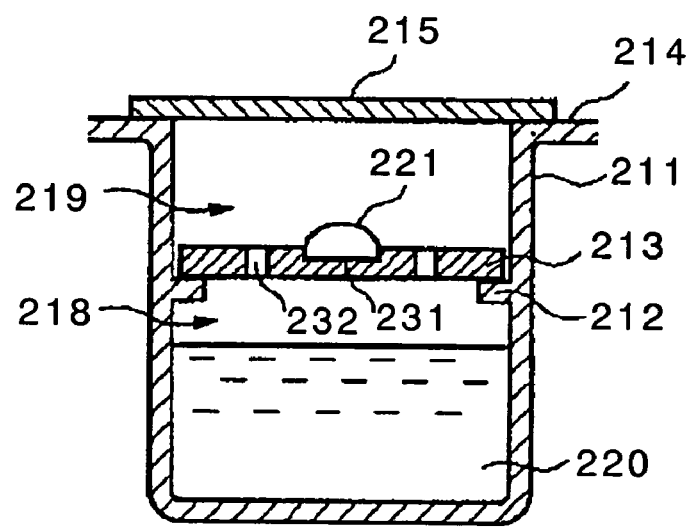
FIG. 3 show another conventional crystal growing technique.
Figure 4:
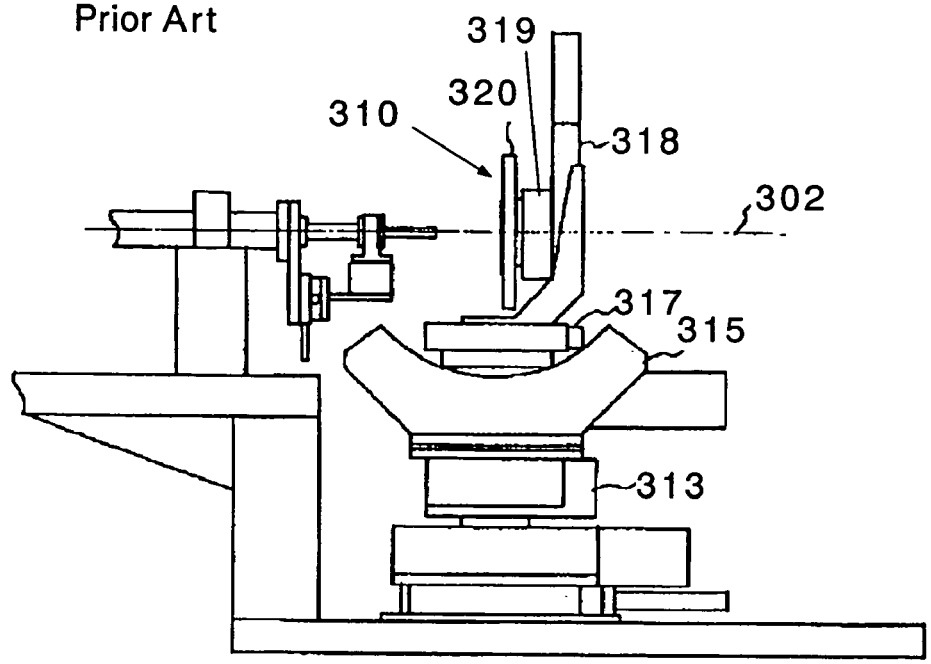
FIG. 4 shows a conventional X-ray analyzing apparatus.
Figure 5:
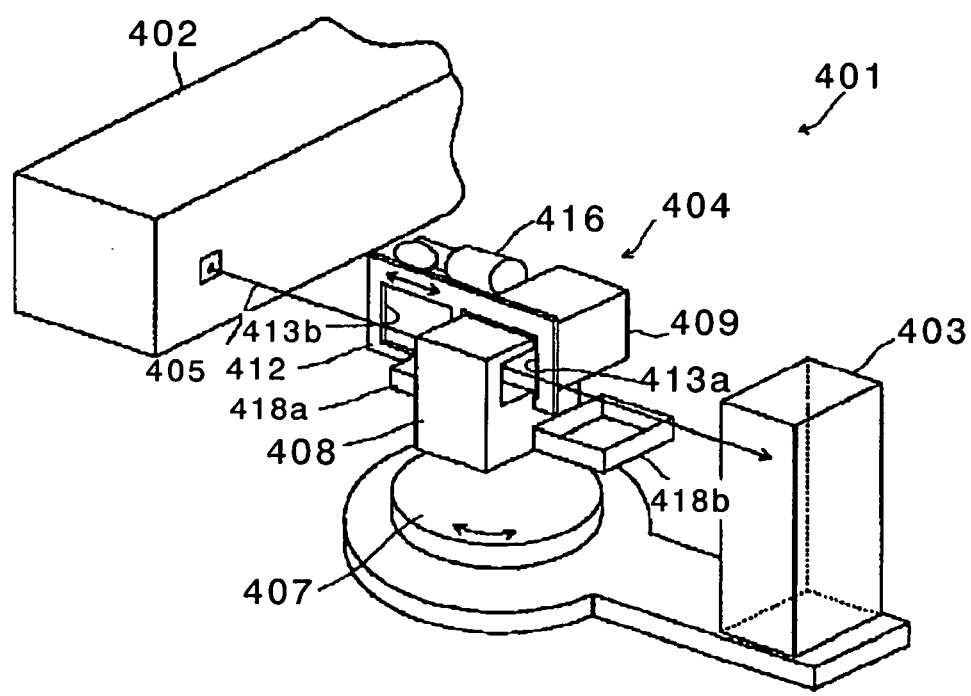
FIG. 5 shows another conventional X-ray analyzing apparatus.
Figure 6:
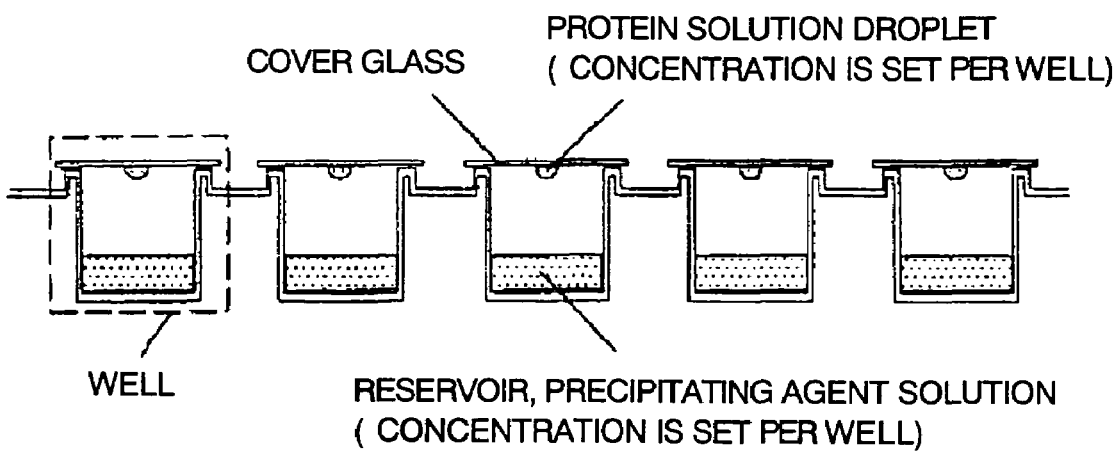
FIG. 6 schematically shows hanging drop method.
Figure 7A:
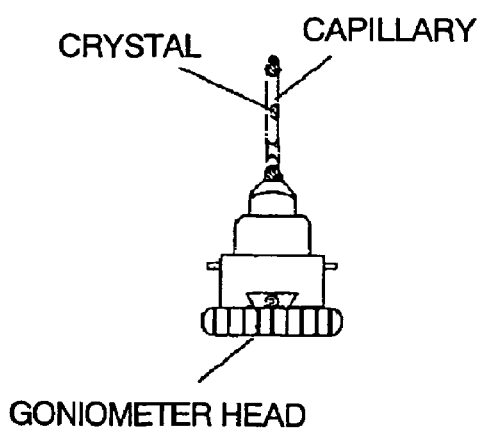
FIGS. 7A and 7B show conventional crystal mounting means.
Figure 7B:
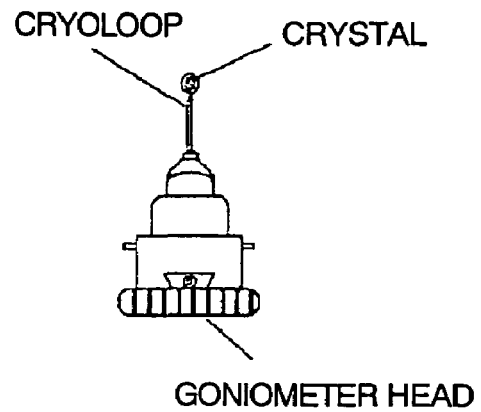

Prepared solution for the droplet 16 is in the unsaturated region A shown in FIG. 1B, and completely dissolves the biological macromolecules therein.

Figure 9A:
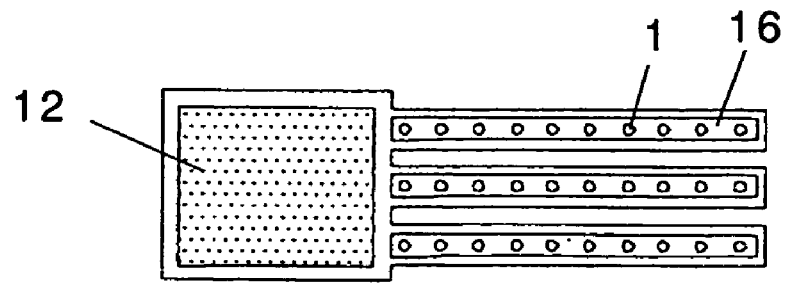
FIGS. 9A, 9B and 9C are plan views showing horizontally set apparatuses for growing a crystal according to the first embodiment of the present invention.
Figure 9B:
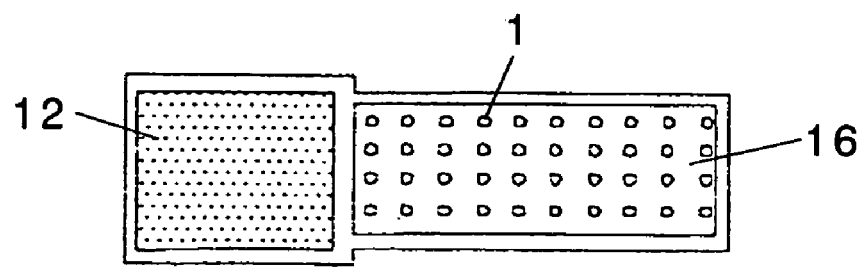
Figure 9C:
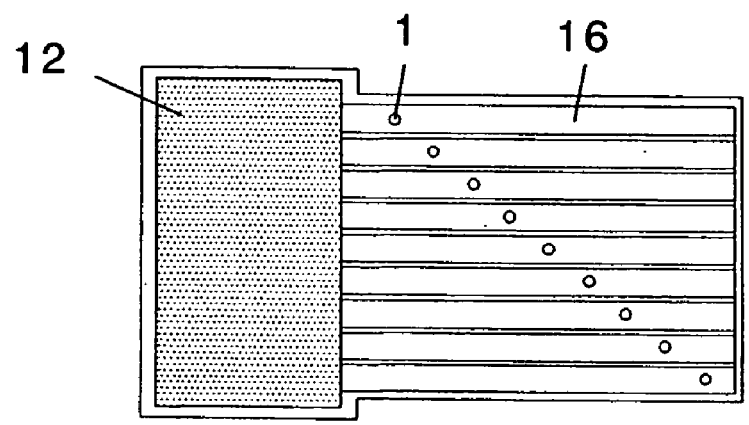

FIGS. 9A, 9B and 9C show other examples of the horizontally set apparatus for growing a crystal shown in FIG. 8A. The apparatus for growing a crystal of FIG. 9A has a plurality of independent tubes, the apparatus for growing a crystal of FIG. 9B has one droplet room, and the apparatus for growing a crystal of FIG. 9C has a plurality of isolated tubes.

In the apparatus for growing a crystal of FIG. 9A, a plurality of tubes 16 are independently provided. Advantageously, by one experiment in the same condition, the apparatus for growing a crystal of FIG. 9A can perform a plurality of times as screenings as the apparatus of FIG. 8A can.

The apparatus for growing a crystal of FIG. 9B has one droplet room that is a single wide communicating tube 16 in which the droplets 1 are distributed in the longitudinal direction and in the width direction. Advantageously, by one experiment, using the single wide communicating tube 16, the apparatus for growing a crystal of FIG. 9B can perform a plurality of times as screenings as the apparatus of FIG. 8A can.

In the apparatus for growing a crystal of FIG. 9C, a single communicating tube 16 is made wide, and divided into a plurality of tube passages that are isolated from each other by longitudinally extending partitions. In each tube passage, the droplet 1 is held. In this example, one droplet 1 is placed in each tube passage to prevent interference between droplets in the same passage tube, the droplets 1 put in the respective tube passages are separated in terms of the longitudinal direction to make difference in a vaporizing speed.

Instead of the configuration of FIG. 9C, the configuration of FIG. 9A may be used for the experiment in which one droplet 1 is put in each of the communicating tubes 16, and the droplets 1 in the respective communicating tubes 16 are separated in the longitudinal direction.

Figure 10A:
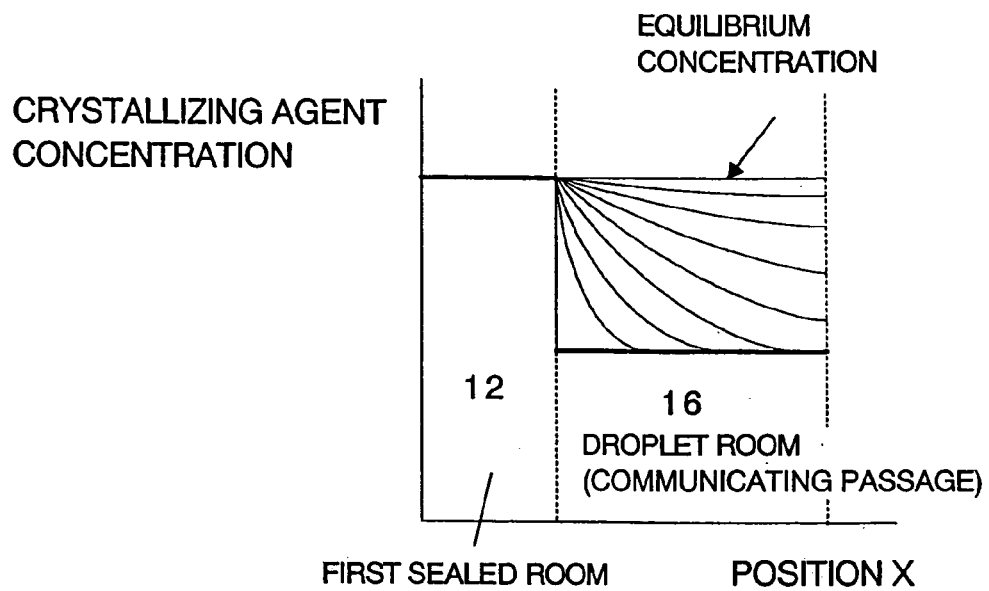
FIG. 10A shows a concentration change of a crystallizing agent in droplets put in a communicating tube.
Figure 10B:
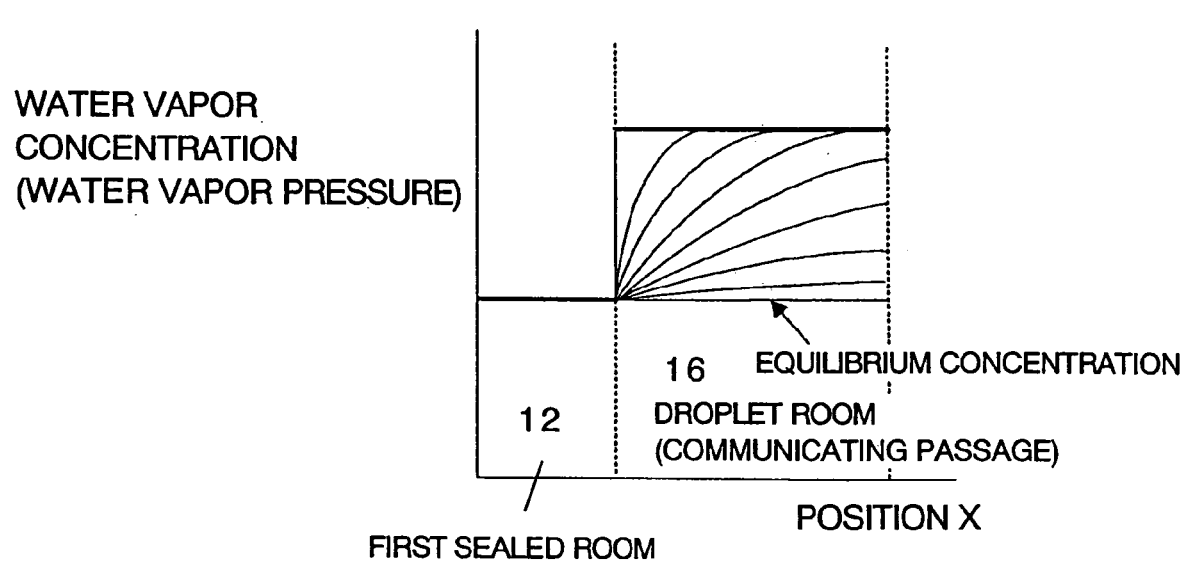

FIG. 10A shows a change of a concentration of a crystallizing agent in the droplet 1 put in the communicating tube 16 shown in FIG. 8A. FIG. 10B shows a change of a concentration of vapor in the communicating tube 16 shown in FIG. 8A. In these drawings, the horizontal axis indicates a distance from the first sealed room 12 located at the left side, and the vertical axis indicates the crystallizing agent concentration in FIG. 10A or the vapor concentration in FIG. 10B. In each of FIGS. 10A and 10B, a plurality of curves schematically indicate the time change until a concentration equilibrium.

According to the first embodiment of the present invention, the sectional area of the communicating tube 16 is so small that the convention can be suppressed, and the first crystallizing agent solution 2 is received in the first sealed room 12 that communicates with the communicating tube 16. Accordingly, as shown in FIGS. 10A and 10B, the vapor is transported by diffusion, and a vaporizing speed differs depending on the droplet position. Therefore, the droplet 1 located near the first sealed room 12 promptly reaches an equilibrium state with the first crystallizing agent solution 2. The droplet 1 located far from the first sealed room 12 takes more time to reach an equilibrium state with the first crystallizing agent solution. Thus, a vaporizing speed gradually changes depending on a distance from a connecting part between the first sealed room and the communicating tube.

In this manner, efficient screening can be performed by one experiment for an additional parameter of a vaporizing speed while fixing the conventional parameters of a crystallizing agent concentration and a crystallizing agent type.

Figure 11A:
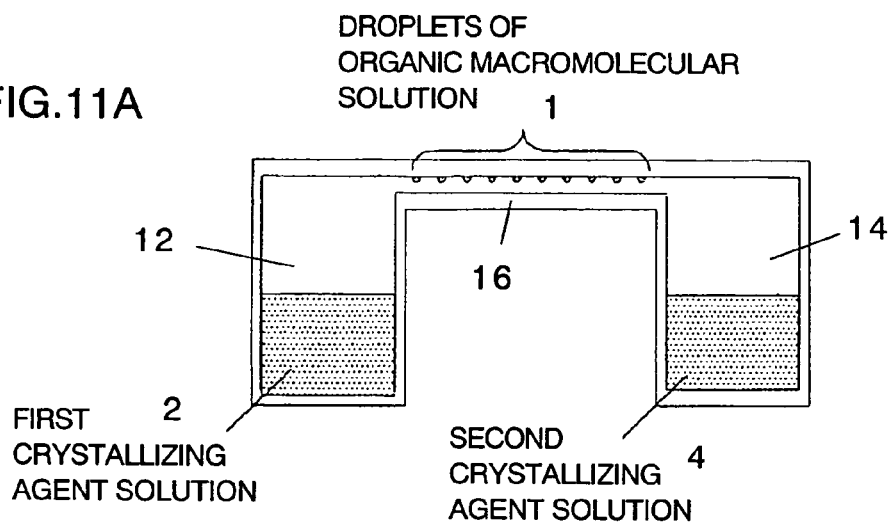
Figure 11B:
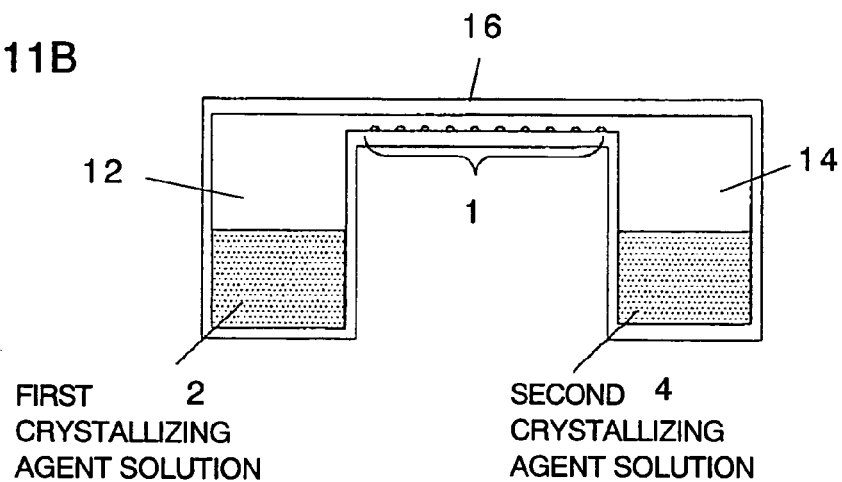
FIG. 11B shows a concentration change of water vapor in the communicating tube according to the first embodiment of the present invention.
Figure 11C:
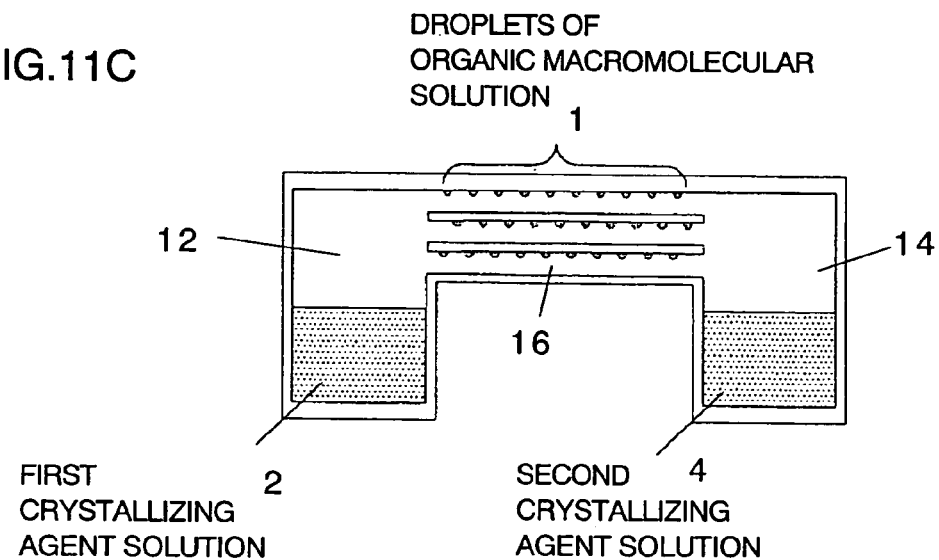

FIGS. 11A, 11B and 11C show apparatuses for growing a crystal according to a second embodiment of the present invention. The apparatus for growing a crystal of FIG. 11A is a hanging type, the apparatus for growing a crystal of FIG. 11B is a sitting type, and the apparatus for growing a crystal of FIG. 11C is a lamination hanging type. In each example of FIGS. 11A, 11B and 11C, the apparatus for growing a crystal includes a first sealed room 12 that receives first crystallizing agent solution, and a second sealed room 14 that receives second crystallizing agent solution of which water vapor pressure is different from water vapor pressure of the first crystallizing agent solution. The second sealed room 14 communicates with the first sealed room 12 through a communicating tube 16.

Prepared solution for a droplet is in the unsaturated region A shown in FIG. 1B, and completely dissolves biological macromolecules therein. The first crystallizing agent solution 2 is received by the first sealed room 12, the second crystallizing agent solution 4 is received by the second sealed room 14, and the communicating tube 16 enables the first and second sealed rooms 12 and 14 to communicate with each other so that water vapor pressure gradient can be generated between the first and second sealed rooms 12 and 14.

In the case of the hanging type shown in FIG. 11A, droplets 1 hangs on a lower surface of an upper plate that constitutes the communicating tube 16. In the case of the sitting type shown in FIG. 11B, droplets 1 are put on an upper surface of a lower plate that constitutes the communicating tube 16. In the case of the lamination type shown in FIG. 11C, a plurality of plates are vertically arranged in the communicating tube 16, and droplets 1 hangs on a lower surface of each plate. Instead of the lamination hanging type, lamination sitting type may be used.

Figure 12A:
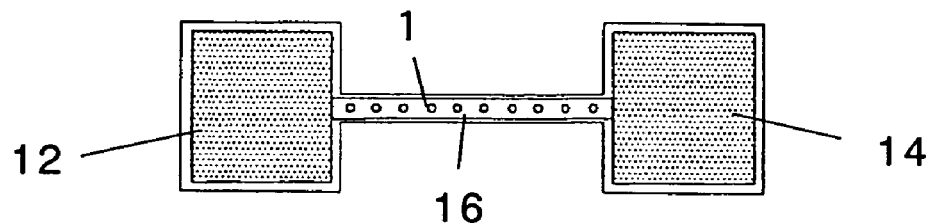
FIGS. 12A, 12B and 12C are plan views of FIGS. 11A, 11B and 11C.
Figure 12B:
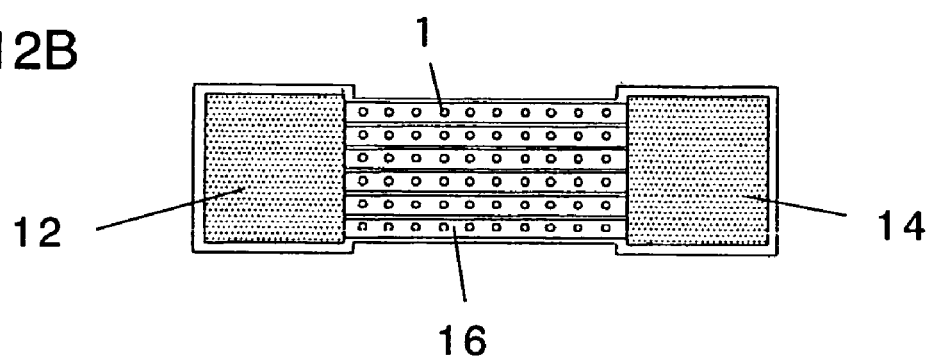
Figure 12C:
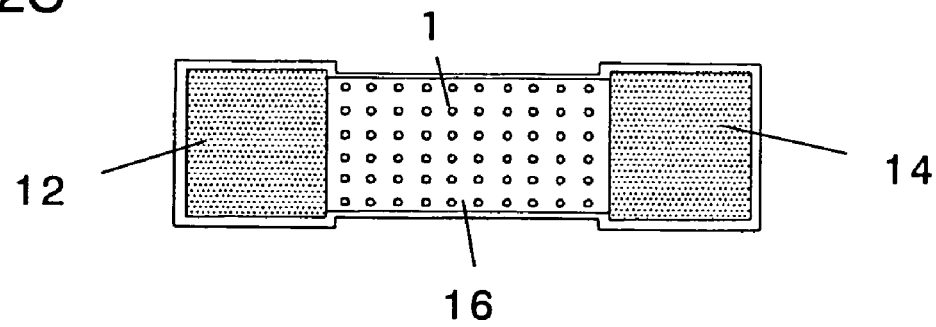

FIGS. 12A, 12B and 12C are plan views of each of FIGS. 11A, 11B and 1C. FIG. 12A shows a single tube type, FIG. 12B shows a partitioned tube type, and FIG. 12C shows a one droplet room type. The apparatus of the single tube type of FIG. 12A is provided with the single communicating tube 16 of FIG. 11A, 11B or 1C, and has an advantage of performing the experiment in a stable condition.

In the partitioned tube type of FIG. 12B, a single communicating tube is made wide, and divided into a plurality of tube passages that are isolated from each other by partitions. The droplets 1 are put in each tube passage. Further, only one droplet 1 is put in each tube passage such that positions of the droplets 1 are displaced from each other in the longitudinal direction. In this manner, it is possible to avoid interference between the droplets 1, so that difference in a vaporizing speed can be made clearer.

In one droplet room type of FIG. 12C, the single communicating tube 16 is made wide, and droplets 1 are distributed in the longitudinal direction and in the width direction. By one experiment, using the single communicating tube 16, the apparatus for growing a crystal of FIG. 12C can perform a plurality of times as screenings as the apparatus of FIG. 12A can.

Figure 13A:
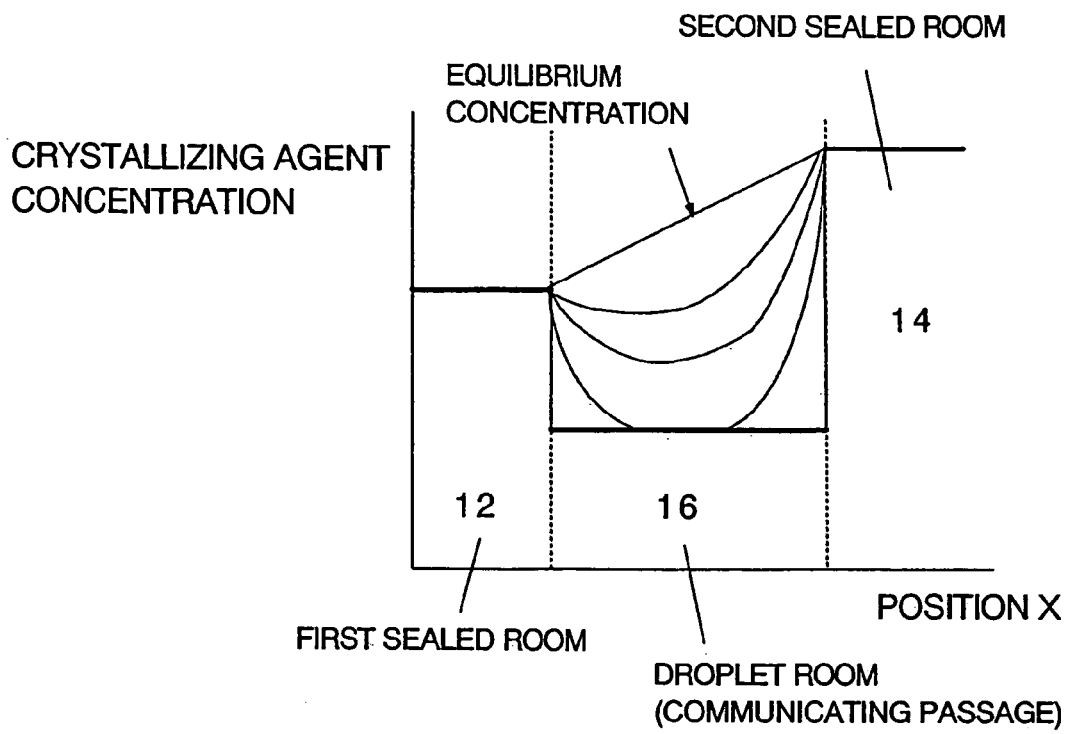
FIGS. 13A and 13B show concentration changes of a crystallizing agent in droplets put in a communicating tube according to the second embodiment of the present invention.
Figure 13B:
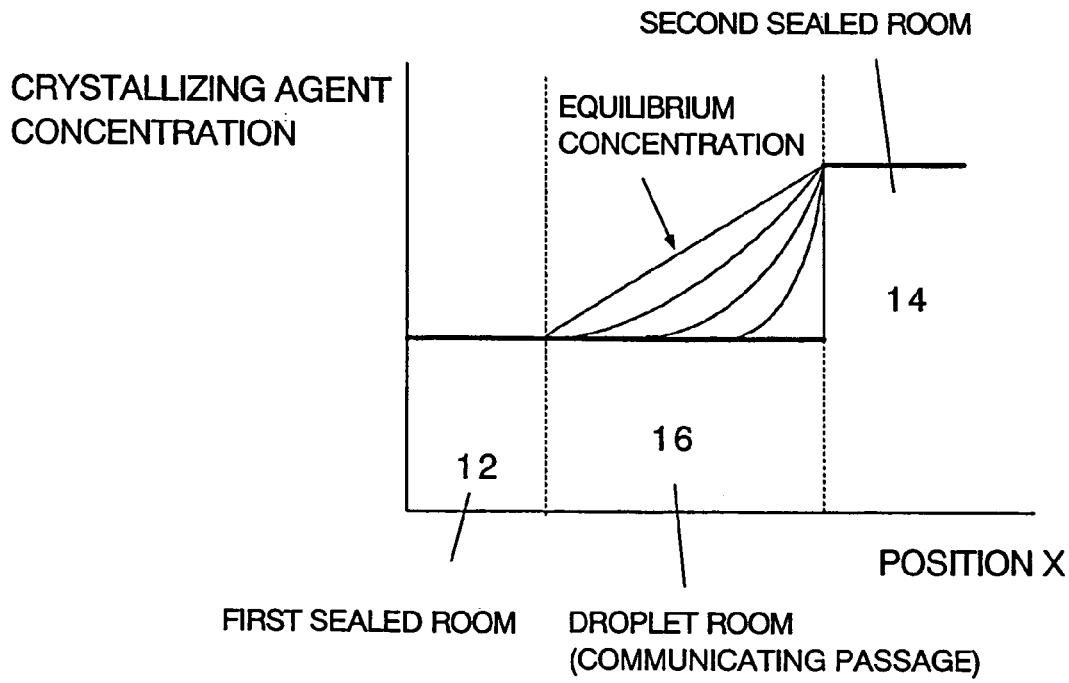

FIGS. 13A and 13B show changes of concentrations of a crystallizing agent in the droplet put in the communicating tube 16 shown in FIGS. 11A and 11B. In the case of FIG. 13A, at the time of starting the experiment, the droplets 1 have the same concentration of the crystallizing agent that is lower than the concentration of the crystallizing agent in each of the first crystallizing agent solution 2 and the second crystallizing agent solution 4. In the case of FIG. 13B, the droplets 1 have the same concentration of the crystallizing agent that is equal to the concentration of the crystallizing agent in the first crystallizing agent solution 2. In FIGS. 13A and 13B, the horizontal axis indicates a position, and the vertical axis indicates a concentration of a crystallizing agent in the droplet. Further, in these drawings, a plurality of curves indicate a time change of the concentration until a concentration equilibrium.

Figure 14A:
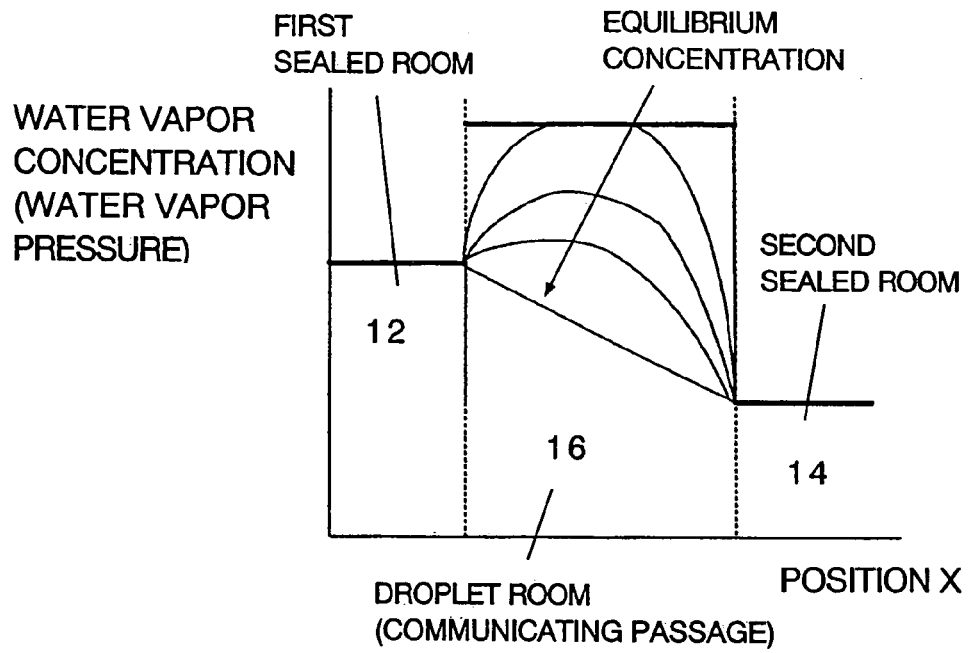
FIGS. 14A and 14B show concentration changes of water vapor in the communicating tube according to the second embodiment of the present invention.
Figure 14B:
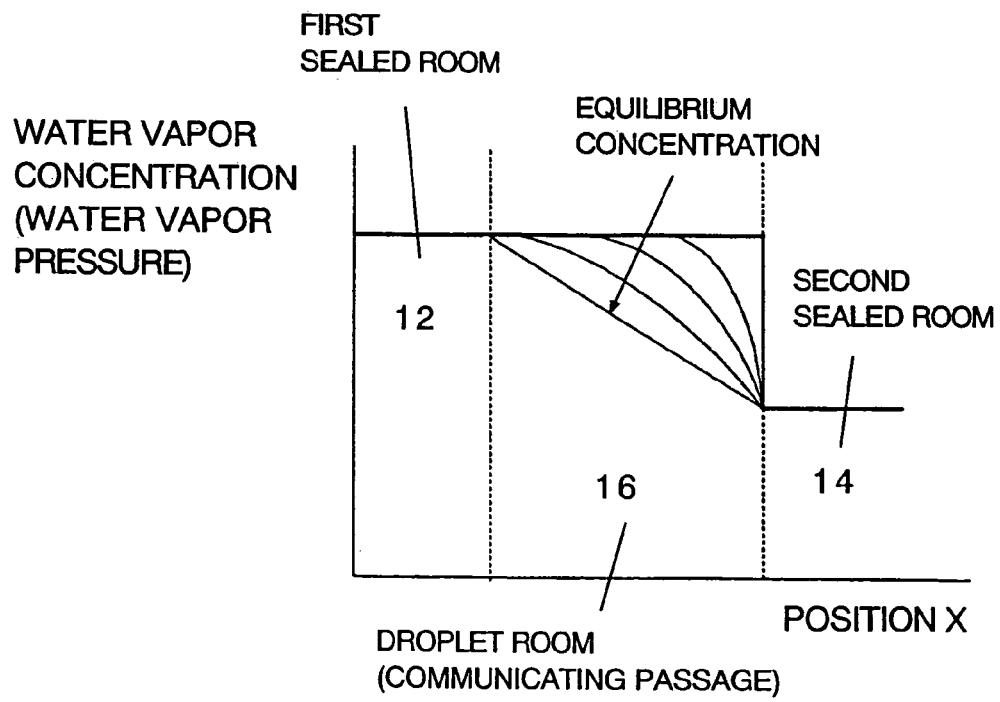

FIGS. 14 and 14B show changes of water vapor concentration in the communicating tube 16 in FIGS. 11A and 11B. In FIGS. 14A and 14B, the horizontal axis indicates a position, and the vertical axis indicates a concentration of the water vapor. In these drawings, a plurality of curves indicate a time change of the water vapor concentration until a concentration equilibrium.

According to the second embodiment of the present invention, the first sealed room 12 communicates with the second sealed room 14 through the communicating tube 16, the first sealed room 12 receives the first crystallizing agent solution 2, and the second sealed room 14 receives the second crystallizing agent 4 of which water vapor pressure is different from water vapor pressure of the first crystallizing agent solution 2 so that water vapor pressures at both ends of the communicating tube 16 can become different from each other, and a gradient of a partial pressure of the vapor is generated between both ends of the communicating tube 16.

The water vapor pressure of the droplet 1 is set to be equal to or higher than the higher of the water vapor pressures of the first or second crystallizing agent solution 2 and 4. Accordingly, the water vapor pressure in the communicating tube is lower than the water vapor pressure of the droplets 1 so that water can evaporate from the droplets 1.

When quantities of the first and second agent crystallizing solutions 2 and 4 are made adequately larger than a quantity of the droplet 1, the droplet 1 near the first crystallizing agent solution is vaporized to have a concentration close to a concentration of the first crystallizing agent solution 2, the droplet 1 near the second crystallizing agent solution is vaporized to have a concentration close to a concentration of the second crystallizing agent solution 4, and the droplet 1 located at middle part of the communicating tube 16 is vaporized to have an intermediate concentration between the first crystallizing agent solution 2 and the second crystallizing agent solution 4. Thereby, even if initial droplets 1 have the same composition, it is possible to make different crystallizing conditions depending on positions in the communicating tube, and to efficiently perform screening by one setting.

Figure 15A:
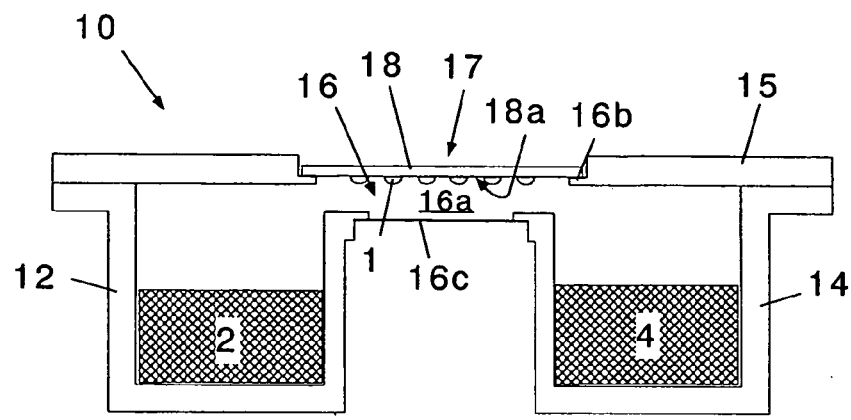
FIGS. 15A and 15B are respectively a sectional view and a plan view showing an apparatus for growing a crystal according to a third embodiment of the present invention.
Figure 15B:
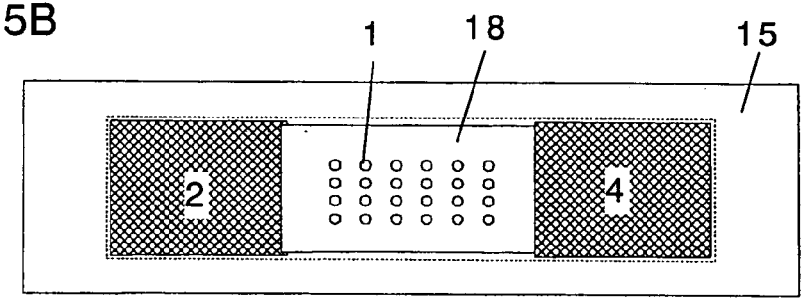

FIG. 15A is a cross-sectional view showing an apparatus for growing a crystal according to a third embodiment of the present invention, and FIG. 15B is a plan view of the apparatus shown in FIG. 15A.

In this example, a crystal growing plate 18 has an exposing part 18a. At least one portion of the exposing part 18a is exposed to the inside of a communicating tube 16. A plurality of droplets 1 each of which is a mixture of biological macromolecular solution and crystallizing agent solution are held at the exposing part 18a with the droplets 1 being separated from each other by a predetermined distance. A water vapor pressure of the droplets 1 is made equal to or higher than the higher of water vapor pressures of first or second crystallizing agent solutions 2 and 4. The crystal growing plate 18 holds a plurality of droplets 1 at a lower surface thereof by surface tension with the lower surface of the crystal growing plate 18 being included in a horizontal plane.

In FIGS. 15A and 15B, the communicating tube 16 includes a growing plate attaching wall 16b that constitutes a side surface of a tube passage 16a. In this example, the growing plate attaching wall 16b is configured as a part of a cover 15 that covers and seals a first sealed room 12 and a second sealed room 14 by grease, an O-ring and the like.

The crystal growing plate 18 is detachably attached to an opening 17 formed in the growing plate attaching wall 16b (in this example, the cover 15) such that the opening is sealed by grease or the like. In FIGS. 15A and 15B, the communicating tube 16 includes a transparent observing wall 16c facing the growing plate attaching wall 16b. The crystal growing can be observed through the transparent observing wall 16c. It is more preferable for observation that not only the observing wall 16 but also the crystal growing plate 18 are transparent. However, if one of the observing wall 16c and the crystal growing plate 18 is made of a transparent material (for example, glass or transparent plastic), crystal growing can be observed.

Instead of the configuration of FIG. 15A, as shown in FIG. 1C, a plurality of crystal growing plates 18 may be vertically laminated in the communicating tube 16 to be separated from each other by a predetermined distance.

In a case where the apparatus for growing a crystal is attached to a X-ray diffraction apparatus together with the grown crystal for X-ray diffraction without taking out the crystal from the apparatus for growing a crystal, both the observing wall 16c and the crystal growing plate 18 are preferably made of a thin, material (for example, glass, plastic or a beryllium) having airtightness, X-ray transparency and X-ray resistance. The transparency is not inevitable for X-ray diffraction, but the transparency facilitates adjusting of a position of an emitted X-ray to the crystal.

Furthermore, in a case where the crystal growing plate 18 is taken out from the apparatus for growing a crystal after crystal growing, and the crystal growing plate 18 is attached to the X-ray diffraction apparatus together with the crystal for X-ray diffraction, the crystal growing plate 18 is preferably made of a thin material having X-ray transparency and X-ray resistance.

When X-ray diffraction after crystal growing as well as observing of the crystal during crystal growing are carried out, it is preferable that both the crystal growing plate 18 and the observing wall 16c are made of a thin material having airtightness, X-ray transparency, and X-ray resistance, and at least one of the crystal growing plate 18 and the observing wall 16c is transparent. In this case, an example of a material for the crystal growing plate 18 and the observing wall 16c is glass or transparent plastic, but beryllium is not an appropriate material because beryllium is a metal that does not have transparency.

Figure 16:
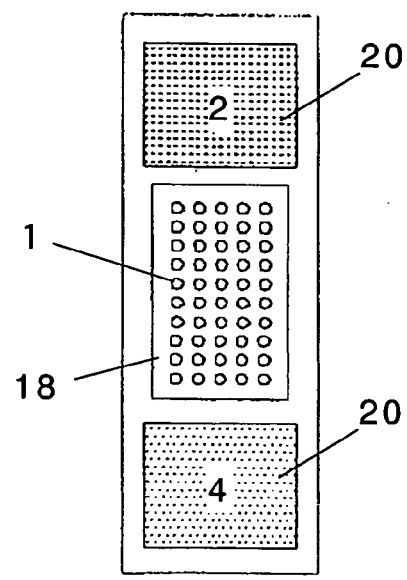
FIG. 16 shows an apparatus for growing a crystal according to a fourth embodiment of the present invention.

FIG. 16 shows an apparatus for growing a crystal according to a fourth embodiment of the present invention.

In the example of FIG. 16, holding bodies 20 are installed in a first sealed room 12 and a second sealed room 14, respectively. The holding bodies 20 soaks up first crystallizing agent solution 2 and second crystallizing agent solution 4. For example, as the holding body, a porous body, a sintered body of resin powder, cotton, cloth or spongy material may be used. In this example, the first sealed room 12 is located at an upper side, the second sealed room 14 is located at a lower side, and a growing plate attaching wall 16b is vertically provided. However, one of the first crystallizing agent solution and the second crystallizing agent solution that provides a lower water vapor pressure may be located at a lower side so that the moving vapor diffusion direction can conform with the gravity direction. In this manner, it is possible to suppress air convection in the communicating tube 16. Other configuration may be the same as the third embodiment.

FIGS. 17A through 17E show examples of a crystal growing plate 18. FIG. 17A shows a film, FIG. 17B shows a plate, FIG. 17C shows a plate having cavities (depressions), FIG. 17D shows a plate having penetration holes, and FIG. 17E shows a lamination configuration that include a film and a plate having penetration holes. As shown in FIG. 17C, when necessary, a droplet 1 may be put in a cavity in accordance with a testing state to firmly hold the droplet 1. Thereby, it is possible to set the apparatus for growing a crystal in a free posture. Furthermore, for X-ray structure analysis, the crystal growing plate 18 of FIG. 17D may be used to prevent unnecessary diffraction at the crystal growing plate 18. In any example of FIGS. 17A through 17E, by gelling of a droplet 1, the apparatus for growing a crystal can be set in a free posture. Further, gelling of the droplet 1 is advantageous for X-ray structure analysis because a crystal can be fixed.

FIGS. 18A and 18B show other examples of a crystal growing plate 18. In FIG. 18A, partitions 19a for partitioning rows of droplets 1 are installed along the vapor diffusion direction. In FIG. 18B, in addition to the partitions 19a, shielding plates 19 are installed along the direction perpendicular to the vapor diffusion direction. When the crystal growing plate 18 is attached to a growing plate attaching wall 16b, the partitions 19a contact with a wall facing the crystal growing plate 18 so that water vapor flow between the neighboring rows of the droplets 1 can be suppressed. Since a height of the shielding plate 19b is smaller than a height of the partition 19a, water vapor flow between neighboring droplets in the vapor diffusion direction is not completely suppressed, and a small gap remains for communication between the neighboring droplets 1 in the vapor diffusion direction.

Thus, by installing the partitions 19a and the shielding plates 19b, it is possible to suppress interference between the droplets, and convection of air in the communicating tube.

According to the fourth embodiment of the present invention, the first sealed room 12 receives the first crystallizing agent solution 2, the second sealed room 14 receives the second crystallizing agent solution 4 of which water vapor pressure is different from a water vapor pressure of the first crystallizing agent solution 2, and the communicating passage 16a that communicates with the first sealed room 12 and the second sealed room 14 is provided to generate a gradient of a water vapor pressure between the first sealed room 12 and the second sealed room 14. Furthermore, at least one portion of the exposing part 18a of the crystal growing plate 18 is exposed to the inside of the communicating passage 16a, and a plurality of droplets 1 including biological macromolecular solution and crystallizing agent solution are held by the exposing part 18a with the droplets 1 being separated from each other. In this manner, crystallization of the biological macromolecules from the droplets 1 can be simultaneously performed.

Furthermore, according to the fourth embodiment of the present invention, the first sealed room 12 communicates with the second sealed room 14 through the communicating tube 16, the first sealed room 12 receives the first crystallizing agent solution 2, the second sealed room 14 receives the second crystallizing agent solution 4 of which water vapor pressure is different from a water vapor pressure of the first crystallizing agent solution 2 so that water vapor pressures at both ends of the communicating tube 16 can become different from each other, and a gradient of the water vapor pressure is generated between both ends of the communicating tube 16.

Further, the water vapor pressure by the droplet 1 is higher than water vapor pressures of the first crystallizing agent solution 2 and the second crystallizing agent solution 4, so that a water vapor pressure in the communicating tube 16 is lower than the water vapor pressure of the droplet 1 so that water can be evaporated from the droplet 1. In addition, a plurality of droplets 1 including biological macromolecular solution are held on the exposing part 18a of the crystal growing plate 18. Quantities of the first crystallizing agent solution 2 and the second crystallizing agent solution 4 are made to be adequately smaller than a quantity of the droplet 1 so that the droplet 1 near the first crystallizing agent solution 12 can be vaporized to have the concentration close to the concentration of the first crystallizing agent solution 2, the droplet 1 near the second crystallizing agent solution 4 can be vaporized to have the concentration close to the concentration of the second crystallizing agent solution 14, and the droplet 1 located at a middle position between the first sand second sealed rooms 12 and 14 can be vaporized to have the intermediate concentration between the concentrations of the first and second crystallizing agent solutions.

Therefore, even when the initial droplets 1 have the same composition, it is possible to set different crystallizing conditions that depend on positions in the communicating tube 16, and to perform efficient screening by one setting.

Figure 19:
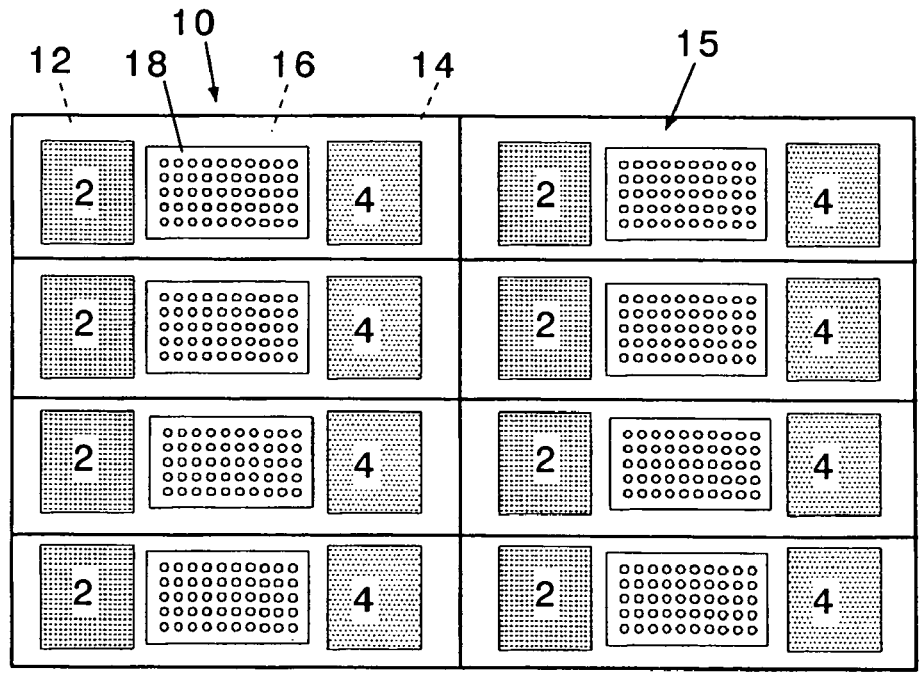
FIG. 19 is a plan view showing an apparatus for growing a crystal according to a fifth embodiment of the present invention.

FIG. 19 shows an apparatus for growing a crystal according to a fifth embodiment of the present invention. FIG. 15A is a plan view similar to FIG. 15B. In this example, a plurality of apparatuses of the third or forth embodiment, for example, of the present invention are connected to configure the apparatus of the fifth embodiment. The apparatus of the fifth embodiment includes a plurality of first sealed rooms 12, a plurality of second sealed rooms 14, a plurality of communicating tubes 16, and a plurality of crystal growing plates 18. The plural first sealed rooms 12 and the plural second sealed rooms 14 are integrally formed, and respective sections are airtightly covered with a cover 15. A plurality of openings are formed on the cover 15, and the crystal growing plate 18 is attached to each opening 17.

In other words, each first sealed room 12 communicate with the single second sealed room 14 through one communicating tubes 16, and the crystal growing plate 18 is attached to the one communicating tube 16. Accordingly, relationship among the one crystal growing plate 18, and the one first sealed room, the one second sealed room 14, and the one communicating tube 16 that are associated to each other is the same as the third embodiment.

Thereby, by using a plurality of first crystallizing solutions 2, second crystallizing agent solutions 4, and crystal growing plates 18, it is possible to attempt a large number of crystallizing conditions of which concentrating conditions are different little by little. Thereby, it is possible to easily perform screening for many conditions by using the apparatus as one container.

Figure 20:
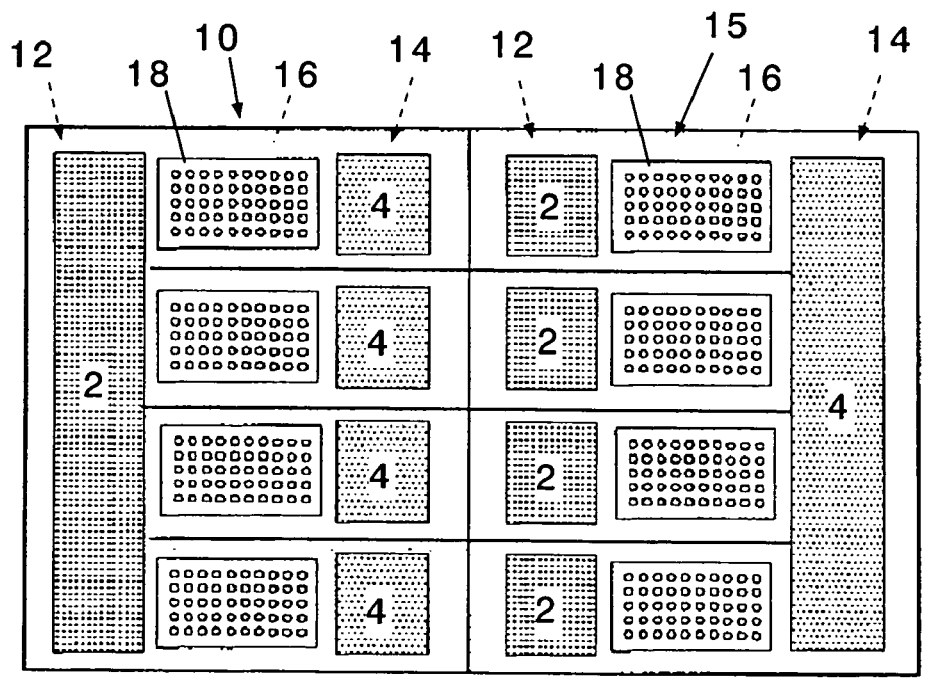
FIG. 20 is a plan view showing an apparatus for growing a crystal according to a sixth embodiment of the present invention.

FIG. 20 shows an apparatus for growing a crystal according to a sixth embodiment of the present invention. FIG. 20 is a plan view similar to FIG. 19. In FIG. 20, the configuration of the right side is different from the configuration of the left side.

The left side of FIG. 20 has the configuration in which four apparatuses for growing a crystal are connected. In the configuration of the left side of FIG. 20, a first sealed room 12 is shared, that is, the configuration of the left side includes the single first sealed room 12, four second sealed rooms 14, four communicating tubes 16, and four crystal growing plates 18. In this example, the four second sealed rooms 14 communicate with the single first sealed room 12 through the different respective communicating tubes 16, and the crystal growing plates 18 are attached to the communicating tubes 16, respectively.

On the other hand, in the configuration of the right hand, four crystallizing apparatuses are connected, and in this example, the configuration of the right side includes four first sealed rooms 12, a single second sealed room 14, four communicating tubes 16, and four crystal growing plates 18. In this example, four first sealed rooms 12 communicates with the single second sealed room 14 through the communicating tubes 16, respectively, and the crystal growing plates 18 are attached to the communicating tubes 16, respectively.

With this configuration of FIG. 20, crystallizing agent solution is shared by a plurality of sections to improve efficiency.

The configuration of FIG. 20 can be modified according to the present invention. For example, the configuration of the right or left side of FIG. 20 may be used as an entire configuration.

Figure 21:
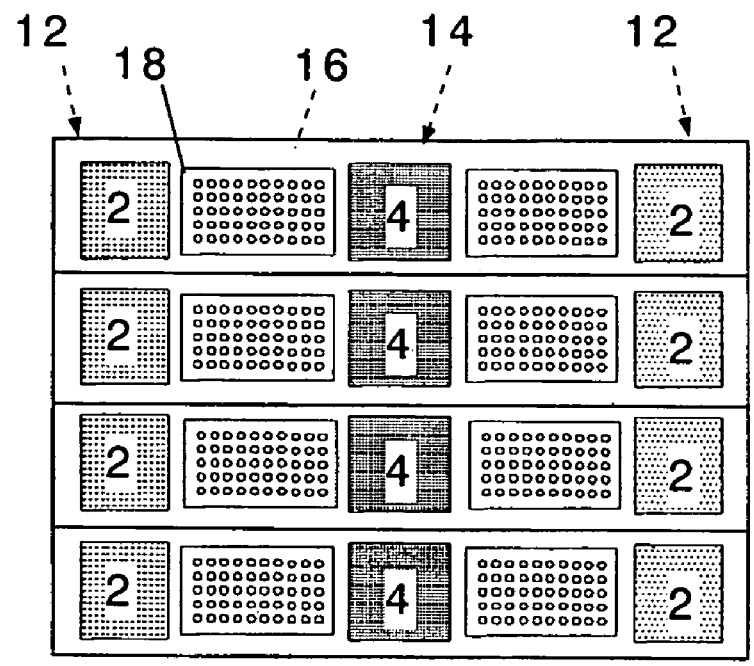
FIG. 21 is a plan view showing an apparatus for growing a crystal according to a seventh embodiment of the present invention.

FIG. 21 shows an apparatus for growing a crystal according to a seventh embodiment of the present invention. In this example, eight apparatuses (of the third or fourth embodiment, for example) are connected, and each row of the entire apparatus for growing crystals includes one central second sealed room 14, two first sealed rooms 12 located both sides of the second sealed room 14, two communicating tubes 16, and two crystal growing plates 18.

Alternatively, each row of the entire apparatus for growing crystals includes one first sealed room 12, two second sealed rooms located at both sides of the first sealed room 12, two communicating tubes 16, and two crystal growing plates 18.

Figure 22:
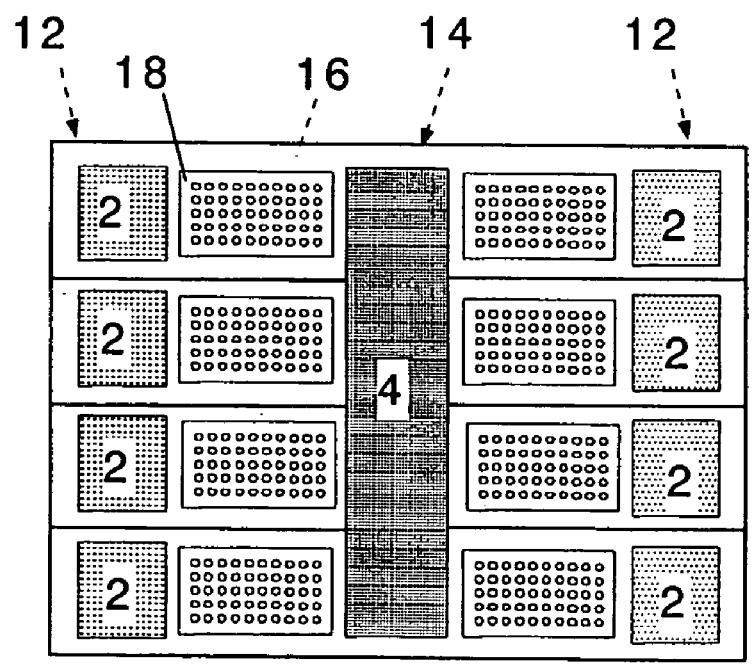
FIG. 22 is a plan view showing an apparatus for growing a crystal according to an eighth embodiment of the present invention.

FIG. 22 shows an apparatus for growing crystals according to an eighth embodiment of the present invention. In this example, four apparatuses of the third or fourth embodiment, for example, are connected, and a central second sealed room 14 is shared, and the entire configuration of FIG. 22 includes the central second sealed room 14, eight first sealed rooms 12, eight communicating tubes 16, and eight crystal growing plates 18 located at both sides of the second sealed room 14. With this configuration, one of the crystallizing solutions is shared by all sections.

Alternatively, the first sealed room 12 may be shared, and the entire configuration includes the first sealed room 12, eight second sealed room 14, eight communicating tubes 16, and eight crystal growing plates 18 located at both sides of the first sealed room 12.

Figure 23:
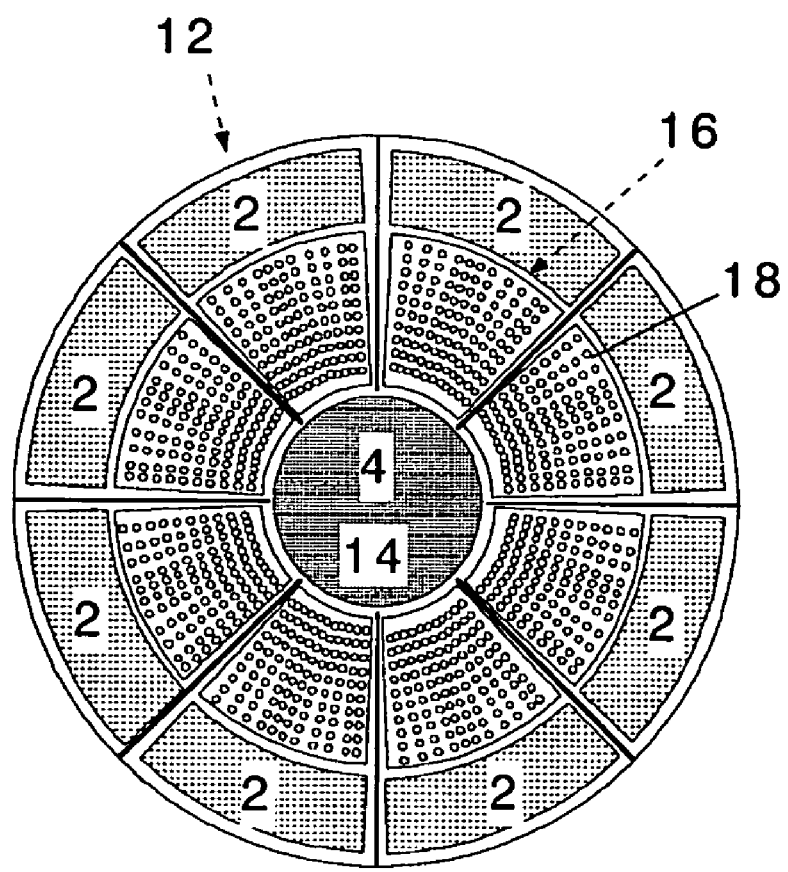
FIG. 23 is a plan view showing an apparatus for growing a crystal according to a ninth embodiment of the present invention.

FIG. 23 shows an apparatus for growing crystals according to ninth embodiment of the present invention. In this example, an entire configuration is made circular. In this example, eight apparatuses are connected, a single second sealed room 14 is made circular, and shared. The configuration of FIG. 23 includes the central second sealed room 14, eight first sealed rooms 12, eight communicating tubes 16, and eight crystal growing plates 18 located around the second sealed room 14.

Alternatively, a single first sealed room 12 may be made circular and located at the center, and the entire configuration may include the single first sealed room 12, eight second sealed rooms 14, eight communicating tubes 16, and eight crystal growing plates 18 located around the first sealed room 12.

Also with configurations of FIGS. 21 through 23, it is possible to attempt a large number of crystallizing conditions of which concentrating conditions of the droplets 1 are different little by little, and to easily perform such screening.

FIG. 24A is a sectional view showing an apparatus for growing crystals according to a tenth embodiment of the present invention, and FIG. 24B is a plan view of FIG. 24A. In this example, the first sealed room 12 and the second sealed room 14 are integrally formed such that an entire configuration is made flat, plate-shaped. Furthermore, in this example, the first sealed room 12 and the second sealed room 14 are filled with porous bodies, respectively. The first crystallizing agent solution 2 and the second crystallizing agent solution are infiltrated into respective porous bodies 20, and soaked up by the porous bodies 20.

FIG. 25A is a cross-sectional view showing an apparatus for growing crystals according to an eleventh embodiment of the present invention, and FIG. 25B is a side view of FIG. 25A. In this example, a first sealed room 12, a second sealed room 14, and a communicating tube 16 are integrally formed such that an entire configuration is vertical, flat, and plate-shaped. Further, in this example, the first sealed room 12 and the second sealed room 14 are filled with porous bodies 20, respectively. The first crystallizing solution 2 and thee second crystallizing agent solution 4 are infiltrated into the porous bodies 20, respectively, and soaked up by the porous bodies 20.

With the configurations of FIGS. 24A, 24B, 25A and 25B, the crystal growing plate 18 can be set horizontally, vertically or in other free postures, and the entire configuration can be made compact. Accordingly, its handling can become easy. Furthermore, in these configurations, by using a gel of the droplet 1, it is possible to fix the crystal even when a posture of the crystal growing plate 18 is changed. Therefore, after crystallization, the crystal growing plate 18 can be applied to X-ray diffraction by using a goniometer having a crystal moving mechanism as described later.

For observing the crystal during crystal growing, it suffices that one of the crystal growing plate 18 and the observing wall 16c is made of a transparent material (for example, glass or transparent plastic). When X-ray diffraction is performed on the crystal through the apparatus for growing crystals, the crystal growing plate 18 and the observing wall 16c is preferably made of a thin material having X-ray transparency, X-ray resistance and airtightness (for example, glass, or beryllium).

When both observing and X-ray diffraction for the crystal are performed through the crystal growing plate 18 and/or the observing wall 16c, the crystal growing plate 18 and the observing wall 16c need to be made of a thin material having X-ray transparency, X-ray resistance and airtightness, and at least one of them needs to be transparent.

Figure 26A:
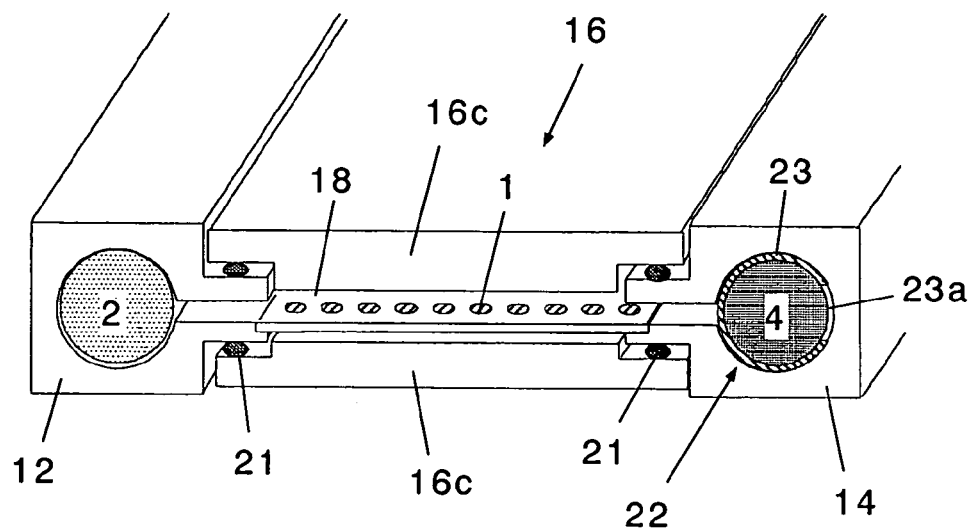
FIGS. 26A and 26B shows an apparatus for growing a crystal according to a twelfth embodiment of the present invention.
Figure 26B:
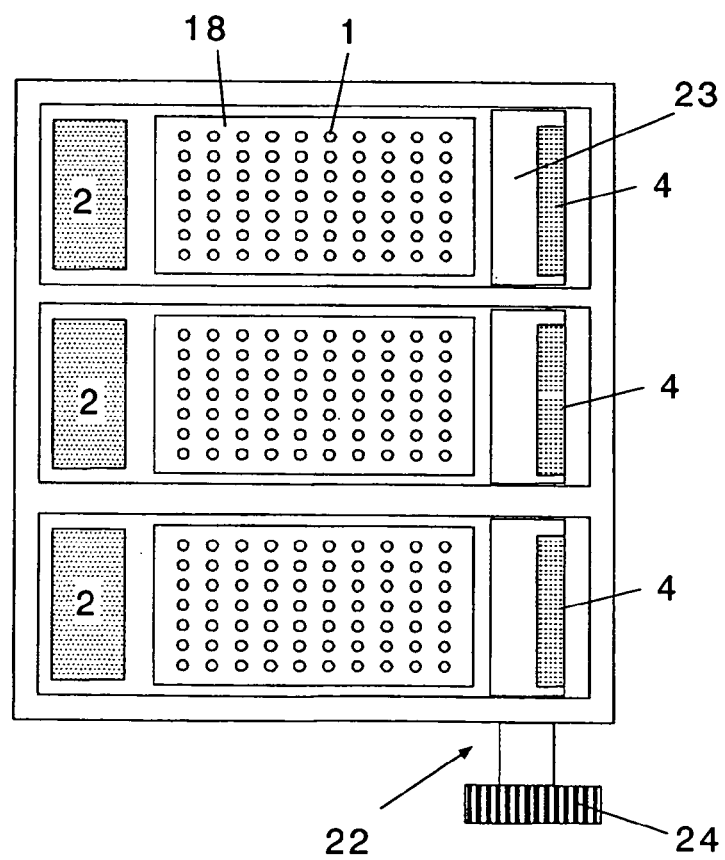

FIG. 26A is a perspective view showing an apparatus for growing crystals according to a twelfth embodiment of the present invention, and FIG. 26B is a plan view of FIG. 26A.

Is FIGS. 26A and 26B, the reference numeral 21 designates a sealing member such as an O-ring for airtight sealing between a first sealed room 12 and a second sealed room 14, and the reference numeral 22 designates a crystallization starting mechanism that can open the second sealed room 14 to the communicating tube 16 and close the second sealed room 14 from the communicating tube. In this example, the crystallization starting mechanism can open and close the second sealed room to and from a space between two observing walls 16c.

The crystallization starting mechanism 22 includes a hollow, cylindrical shade 23 and a crystallization starting gear 24 that rotates the shade 23 around its axis. The shade 23 includes a slit 23a that is formed on a cylindrical part of the slit 23a and extends in the axial direction. The shade 23 is rotated such that the slit 23a faces a space between two observing walls 16c. Thereby, it is possible to start vapor diffusion and crystallization.

The example of FIGS. 26A and 26B is particularly suitable to a space experiment because the experiment in space requires a crystallization starting mechanism that does not cause crystallization on the earth, and starts crystallization when the apparatus for growing crystals is brought to an orbit around the earth.

In this example, a concentration of the first crystallizing agent solution 2 is preferably set such that the first crystallizing agent solution 2 does not cause the concentration change of the droplet 1. For example, the concentration of the first crystallizing solution 2 is set such that a water vapor pressure of the first crystallizing agent solution 2 is the same as that of the droplet 1. Meanwhile, a concentration of the second crystallizing agent solution 4 is set such that the second crystallizing agent solution 4 can cause concentration change of the droplet 1. For example, a concentration of the second crystallizing agent solution 4 is set such that a water vapor pressure of the second crystallizing agent solution 4 is lower than that of the first crystallizing agent solution 2 (i.e., the droplet 1). At first, the second crystallizing agent solution 4 is isolated from a space where droplets 1 are put (that is, a space between two observing walls) by the shade 23 having the slit 23a. When the apparatus for growing crystals is brought to an orbit around the earth, the gear is rotated by a driving mechanism (not shown in the drawing) to rotate the shade 23 so that the second crystallizing agent solution 4 can be exposed to the space where the droplets 1 are placed (space between two observing walls 16c). Thereby, crystallization is started.

The crystallization starting mechanism 22 is not limited to the above-described configuration, and may have any configuration that can open the second sealed room 14 (and/or the first sealed room 12) to the communicating tube 16 and close the second sealed room 14 (and/or the first sealed room 14) from the communicating tube 16. In a state where the first sealed room 12 (and/or second sealed room 14) is closed by the crystallization starting mechanism, the apparatus for growing crystals is launched from the earth, and when the apparatus for growing crystals reaches the space environment, the second sealed room 14 (and/or first sealed room 14) can be opened to the communicating tube 16 by the crystallization starting mechanism to start crystallization.

According to the first embodiment through the twelfth embodiment, compared to the conventional technique, simple and efficient screening can be performed in the following vapor diffusion method.

Conventionally, a pair of a droplet (of solution dissolving biological macromolecules and a crystallizing agent) and crystallizing agent solution is put in a well of a closed system, or one crystallizing agent solution and a plurality of droplets are put in the closed system. On the other hand, according to the present invention, the container includes two crystallizing agent solution rooms that receive two crystallizing agent solutions that have different concentrations of crystallizing agents and accordingly have different water vapor pressures. The two crystallizing agent solution rooms are connected. In the container (the apparatus for growing crystals), a plurality of droplets of solution dissolving biological macromolecules and a crystallizing agent therein are put in the connecting part between the two crystallizing agent solution rooms with the connecting part being airtightly closed from outside to form one entire closed space. The concentrations of the two crystallizing agent solutions A and B, and the droplets are changed such that water vapor pressure in the entire space becomes uniform. However, when each quantity of the two crystallizing agent solutions A and B is made adequately larger than a quantity of the droplets 1, the concentrations of the two crystallizing agent solutions hardly change in a time scale that crystallization occurs in the droplets. Since the water vapor pressure differs depending on the positions of the droplets, in this time scale, the droplet near the crystallizing agent solution A comes to have the concentration close to that of the crystallizing solution A, and the droplet near the crystallizing agent solution B comes to have the concentration close to that of the crystallizing agent solution B. The droplet located at the middle position between the two crystallizing agent solutions comes to have the intermediate concentration between the concentrations of the two crystallizing agent solutions. Therefore, the droplets have the different concentrating conditions depending on the distance from the two crystallizing agent solutions. The communicating part where the droplets are placed is made narrow so that uniformalization of the water vapor pressure in the communicating part due to the convection of air can be suppressed. Thereby, it is possible to more distinguish the concentrating conditions that depend on the positions.

Conventionally, in order to perform screening for "n" number of concentrations by using crystallizing agent solution, it is necessary to prepare "n" number of crystallizing agent solutions having different concentrations put in the wells. On the other hand, according to the present invention, one setting enables screening for concentrating conditions set between the two crystallizing agent solutions A and B. Thereby, it is possible to greatly improve efficiency of the screening.

Accordingly, the present invention can achieve the following advantages.

(1) Conventionally, since a droplet of biological macromolecular solution put in one closed room comes to equilibrium with one crystallizing agent solution, when attempting many crystallizing conditions, it becomes necessary to prepare many crystallizing solutions having different concentrations that are put in many closed rooms. However, according to the present invention, one setting can produce different concentrating conditions that differ little by little depending on the positions in the closed container, so that labor can be greatly saved in attempting many conditions.

(2) A space directly below a droplet that is conventionally occupied by crystallizing agent solution can be used in the present invention, so that a physical or chemical state of the crystal or solution of the droplet can be easily observed from the vertical direction.

(3) The number of used crystallizing agent solutions can be greatly reduced, and droplets of biological macromolecular solution can be put in a high density, so that the apparatus for growing crystals can be downsized.

(4) X-ray diffraction can be applied to the container itself or the crystal growing plate taken out from the container without taking out the droplets from the container.

(5) It is possible to achieve automation of the crystallization of the biological macromolecules, and high processing efficiency of the automatic apparatus. Further, the space experiment apparatus can be made.

Figure 27:
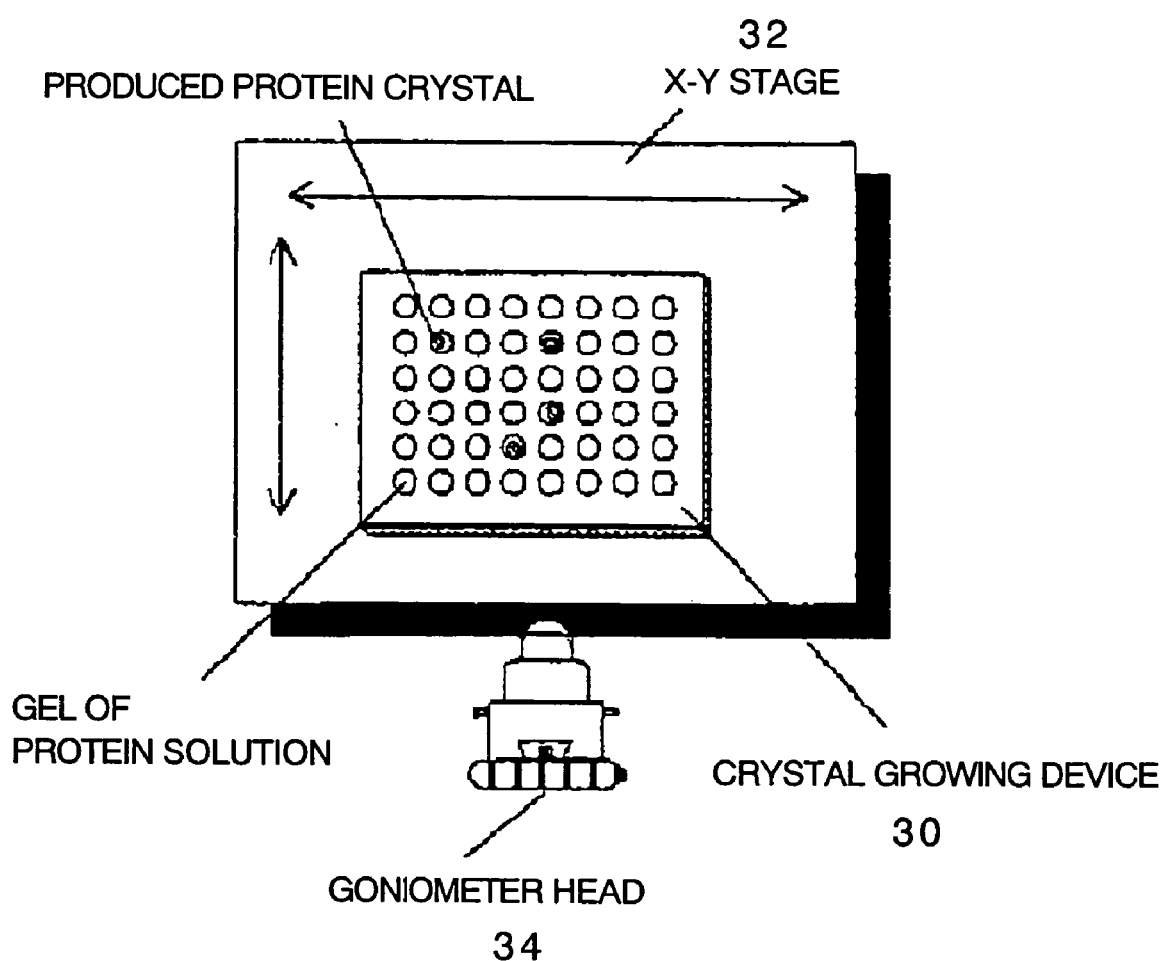
FIG. 27 shows one example of a crystal analyzing apparatus according to the present invention.

FIG. 27 shows one example of an apparatus for analyzing a crystal according to the present invention. As shown in FIG. 27, the apparatus for analyzing a crystal includes an apparatus 30 for growing crystals, a crystal moving device 32 (crystal moving mechanism) 32, and a goniometer head 34.

In the apparatus 30, crystallizing targets of droplets of biological macromolecular solution are two-dimensionally arranged in high density on a crystal growing plate 18 that has X-ray transparency and X-ray resistance to produce crystals in the biological macromolecular solutions. Any of the above-described apparatuses of the first embodiment through the twelfth embodiment may be used for the apparatus 30 of the apparatus for analyzing a crystal. As shown in FIG. 27, the droplets 1 of the biological macromolecular solution are preferably arranged two-dimensionally in a high density by a predetermined pitch in the X direction and the Y direction. Furthermore, it is preferable to use gels of the biological macromolecular solution.

The crystal moving device 32 can two-dimensionally move the apparatus 30 parallel to the plane on which the droplets are arranged. Thereby, an arbitrary crystal on the apparatus 30 for growing crystals can be moved to a position on the X-ray beam and on a rotational axis (such as ω axis, χ axis or φ axis) of a sample rotating device. The specific configuration of the crystal moving mechanism is not described, but a known traversing mechanism can be used for this. Furthermore, in accordance with necessity, the apparatus for growing crystals may be vertically moved.

The crystal moving mechanism 32 can be attached to the goniometer head. By using a coupling jig for coupling of the goniometer and the crystal moving device, a known goniometer can be used.

A method using the above-described apparatus for analyzing a crystal according to the present invention includes a crystal growing step (A), a growing apparatus attaching step (B), and a X-ray analyzing step (C).

In the crystal growing step (A), by the apparatus for growing crystals, crystallization is performed on droplets of biological macromolecular solutions two-dimensionally arranged in high density on the crystal growing plate. Preferably, after the biological macromolecule is crystallized, the droplet 1 containing the crystal is made to become a gel. Alternatively, the biological macromolecular solution is previously made to be gel, and thereafter, crystallization is performed on the gel.

In the growing apparatus attaching step (B), the apparatus 30 or the crystal growing plate taken out from the apparatus 30 is attached to a X-ray analyzing apparatus via the goniometer head 34.

In the X-ray analyzing step (C), a crystal on the apparatus 30 is moved to the position on the X-ray beam and on the rotational axis (such as ω axis, χ axis or φ axis) of the sample rotating device for X-ray, and the X-ray analysis is performed on the crystal. These processes are repeatedly performed.

According to the above-described apparatus and method for analyzing a crystal, in the crystal growing step (A), by the apparatus 30, crystallization is performed on droplets of biological macromolecular solution two-dimensionally arranged on the crystal growing plate in high density. Subsequently, in the growing apparatus attaching step (B), the apparatus for growing crystals or one member (e.g., crystal growing plate) of the apparatus for growing crystals is attached to the crystal moving mechanism, and in the X-ray analyzing step (C), the apparatus for growing crystals is moved by the crystal moving mechanism to successively perform X-ray analysis on a large number of the biological macromolecular crystals.

As described above, according to the apparatus and method for analyzing a crystal shown in FIG. 27, after the apparatus for growing crystals produces crystals, the apparatus itself for growing crystals is attached to the X-ray analyzing apparatus. Therefore, it is possible to save labor for taking out the crystals from the biological crystal macromolecular solution.

In other words, the apparatus 30 itself holding many crystals is attached to the X-ray analyzing apparatus, or one member (for example, crystal growing plate) of the apparatus 30 that holds many crystals is attached to the X-ray analyzing apparatus. In this manner, it is possible to save the trouble of taking out the produced crystals one by one, and attaching the crystal to a goniometer head by using a capillary or a cryoloop.

In order to save such a trouble, the apparatus for growing crystals is entirely downsized, crystallizing targets of droplets of biological macromolecular solution are two-dimensionally arranged in high density, and the droplets of the biological macromolecular solution are put on a thin plate made of a material such as resin, glass or beryllium that has X-ray transparency, X-ray resistance and airtightness.

Preferably, mother liquid containing the crystal is made to be a gel, or the biological macromolecular solution is previously made to be a gel, and the crystallization is performed on the gel of the biological macromolecular solution. By using the gel, it is possible to fix the crystal in the gel by taking advantage of nature of the gel.

Furthermore, the goniometer head is prepared that has the crystal moving mechanism to which the apparatus for growing crystals or the crystal growing plate can be attached. By mounting on the crystal moving mechanism the apparatus that has produced crystals, any produced crystal can be moved to a predetermined analyzing position that is located on an X-ray beam and on the rotational axis of the sample rotating device. Therefore, by one mounting operation, the target crystal can be successively changed, so that working efficiency for the configuration analysis can be improved.

The apparatus and method for analyzing a crystal according to the present invention can achieve the following advantages.

According to the present invention, it is possible to enable the apparatus for growing crystals to have both functions of crystal growing and mounting for X-ray analysis. Further, many crystals can be mounted on the X-ray analyzing apparatus at the same time. In addition, it is possible to save the trouble of taking out the crystal, greatly reducing crystal mounting labor.

In order to achieve ultimately high throughput, it is considered to fully automate a series of processes from crystallization to structure analysis, for high processing efficiency. There are conventional cases where sample attaching operation for crystallization is automated, and many capillaries or cryoloops to which crystals are attached are automatically attached to the goniometer head. However, the working of taking out the crystal and mounting the crystal on a capillary or cryoloop has been manually carried out by a skilled person, and is difficult to be automated. On the other hand, according to the present invention, it is possible to save the working of taking out the crystal. Therefore, the present invention is advantageous particularly in constructing a space experiment apparatus that requires an automated system or automation.

As described above, by the apparatus and method for growing crystals of the present invention, the screening in which crystallization is performed by changing a concentrating condition of a droplet 1 little by little can be easily carried out by a small setting number of times. In addition, such crystallization of biological macromolecular solution can be carried out in a space environment.

Furthermore, the apparatus and method for growing a crystal of the present invention can perform screening that takes into account a parameter of a concentrating speed by one experiment.

Moreover, the apparatus and method for analyzing a crystal of the present invention can efficiently perform the structure analysis of a plurality of biological macromolecular crystals to streamline and automate the working that is manually performed in the conventional case. Therefore, it is possible to realize high throughput.

The present invention is not limited to the above-described embodiments and examples, and various modifications and improvements can be made without departing from the scope of the present invention.

What is claimed is:

1. An apparatus for growing a crystal by vaporizing biological macromolecular solution into an oversaturated state, comprising:
    a first sealed room that receives first crystallizing agent solution; and
    a communicating tube that communicates with the first sealed room and has a small sectional area for suppressing convection of air,
    wherein a plurality of droplets of solution dissolving a biological macromolecule and a crystallizing agent therein are held in the communicating tube with the plurality of droplets being separated from each other.

2. The apparatus for growing a crystal according to claim 1, further comprising a second sealed room that communicates with the first sealed room through the communicating tube, and receives second crystallizing solution of which water vapor pressure is different from water vapor pressure of the first crystallizing agent solution.

3. The apparatus for growing a crystal according to claim 1, further comprising a crystal growing plate that holds the plurality of droplets separated from each other in the communicating tube.

4. The apparatus for growing a crystal according to claim 3, wherein the communicating tube includes a growing plate attaching wall that constitutes a side surface of a communicating passage in the communicating tube,
    and the crystal growing plate is detachably attached to an opening formed on the growing plate attaching wall to airtightly close the opening.

5. The apparatus for growing a crystal according to claim 4, wherein the communicating tube includes an observing wall that faces the growing plate attaching wall.

6. The apparatus for growing a crystal according to claim 3, comprising:
    a plurality of first sealed rooms;
    a plurality of second sealed rooms;
    a plurality of communicating tubes; and
    a plurality of crystal growing plates,
    wherein each of the plurality of first sealed rooms communicates with one of the plurality of second sealed rooms through one of the plurality of communicating tubes, and the plurality of communicating tubes are provided with the plurality of crystal growing plates, respectively.

7. The apparatus for growing a crystal according to claim 3, comprising:
    a plurality of second sealed rooms;
    a plurality of communication tubes;
    a plurality of crystal growing plates,
    wherein the plurality of second sealed rooms communicates with the first sealed room through the plurality of communication tubes, respectively, and the plurality of communicating tubes are provided with the plurality of crystal growing plates, respectively.

8. The apparatus for growing a crystal according to claim 1, further comprising a holding body set in the first sealed room and/or the second sealed room for soaking up the first crystallizing agent solution and/or the second crystallizing agent solution.

9. The apparatus for growing a crystal according to claim 3, wherein gels of the plurality of droplets are held by the crystal growing plate.

10. The apparatus for growing a crystal according to claim 1, further comprising a crystallization starting mechanism that opens the first sealed room and/or the second sealed room to the communicating tube, and closes the first sealed room and/or the second sealed room from the communicating tube.

11. The apparatus for growing a crystal according to claim 3, wherein the crystal growing plate includes cavities or penetration holes for holding the plurality of droplets that are separated from each other.

12. The apparatus for growing a crystal according to claim 3, wherein the crystal growing plate is provided with one or more partitions or shielding plates for reducing interference between the plurality of droplets and suppressing convection of air.

13. A method for growing a crystal, comprising the steps of:
    putting in a communicating tube a plurality of droplets separated from each other, wherein the plurality of droplets are made of solution dissolving a biological macromolecule and a crystallizing agent therein, the communicating tube communicates with a room that receives first crystallizing agent solution, and the communicating tube has a sectional area that suppresses convection of air; and
    holding the plurality of droplets in the communicating tube until the plurality of droplets are vaporized into an oversaturated state to produce biological macromolecular crystals.

14. The method for growing a crystal according to claim 13, wherein the communicating tube further communicates with a room that receives second crystallizing agent solution of which water vapor pressure is different from water vapor pressure of the first crystallizing agent solution.

15. A crystal analyzing apparatus comprising:
    an apparatus for growing biological macromolecular crystals from a plurality of droplets of biological macromolecular solution that are two-dimensionally and densely arranged on a crystal growing plate that has X-ray transparency and x-ray resistance;

a crystal moving mechanism to which the apparatus for growing a crystal or the crystal growing plate taken out from the apparatus for growing a crystal is attached; and a goniometer head that enables the apparatus for growing a crystal or the crystal growing plate to be attached to a sample rotating mechanism of a X-ray analyzing apparatus.

16. A method for analyzing a crystal, comprising:

a crystal growing step of performing crystallization on a plurality of droplets of biological macromolecular solution that are two-dimensionally and densely arranged on a crystal growing plate of an apparatus for growing a crystal;

a growing apparatus attaching step of attaching the apparatus for growing a crystal or the crystal growing plate to a crystal moving mechanism that is attached to a X-ray analyzing apparatus via a goniometer; and a X-ray analyzing step of successively moving biological macromolecular crystals on the crystal growing plate by the crystal moving mechanism to a position on a X-ray beam and on a rotational axis of the sample rotating mechanism to repeatedly perform X-ray analysis of the biological macromolecular crystals.

17. The apparatus for growing a crystal according to claim 2, further comprising a crystal growing plate that holds the plurality of droplets separated from each other in the communicating tube.

18. The apparatus for growing a crystal according to claim 2, further comprising a holding body set in the first sealed room and/or the second sealed room for soaking up the first crystallizing agent solution and/or the second crystallizing agent solution.

19. The apparatus for growing a crystal according to claim 2, further comprising a crystallization starting mechanism that opens the first sealed room and/or the second sealed room to the communicating tube, and closes the first sealed room and/or the second sealed room from the communicating tube.

* * * * *